(12) United States Patent
Fujikata

(10) Patent No.: US 9,972,510 B2
(45) Date of Patent: May 15, 2018

(54) SUBSTRATE CLEANING APPARATUS AND SUBSTRATE CLEANING METHOD

(71) Applicant: EBARA CORPORATION, Tokyo (JP)

(72) Inventor: Jumpei Fujikata, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days. days.

(21) Appl. No.: 13/776,859

(22) Filed: Feb. 26, 2013

(65) Prior Publication Data
US 2013/0220383 A1  Aug. 29, 2013

(30) Foreign Application Priority Data

Feb. 27, 2012  (JP) ................................ 2012-040239
Feb. 21, 2013  (JP) ................................ 2013-032534

(51) Int. Cl.
*H01L 21/67* (2006.01)

(52) U.S. Cl.
CPC .... *H01L 21/67017* (2013.01); *H01L 21/6723* (2013.01); *H01L 21/67051* (2013.01); *H01L 21/67057* (2013.01)

(58) Field of Classification Search
CPC ........... H01L 21/67057; H01L 21/6708; H01L 21/67051; B08B 3/02
USPC ......................................................... 134/199
See application file for complete search history.

(56) References Cited

U.S. PATENT DOCUMENTS

| | | | | |
|---|---|---|---|---|
| 5,261,431 A | * | 11/1993 | Ueno et al. | ............ 134/66 |
| 5,421,987 A | * | 6/1995 | Tzanavaras | ............ C25D 5/08 |
| | | | | 204/212 |
| 5,651,836 A | * | 7/1997 | Suzuki | ............ B08B 3/102 |
| | | | | 134/34 |
| 6,416,587 B1 | * | 7/2002 | Lu et al. | ............ 134/2 |
| 2002/0166569 A1 | * | 11/2002 | Harvey et al. | ............ 134/1.3 |
| 2003/0134498 A1 | * | 7/2003 | Chen | ............ H01L 21/2885 |
| | | | | 438/614 |
| 2003/0221712 A1 | | 12/2003 | Yang et al. | |
| 2004/0037682 A1 | | 2/2004 | Yoshioka et al. | |

(Continued)

FOREIGN PATENT DOCUMENTS

CN  102246277 A  11/2011
JP  61-61425 A  3/1986

(Continued)

OTHER PUBLICATIONS

European Patent Application No. 13000929.3; Extended Search Report; dated Feb. 20, 2018; 9 pages.

*Primary Examiner* — Marc Lorenzi
(74) *Attorney, Agent, or Firm* — Baker & Hostetler LLP

(57) ABSTRACT

A substrate cleaning apparatus for cleaning a substrate is provided. The apparatus includes a cleaning bath in which a substrate holder holding a substrate is disposed in a vertical position, the substrate holder having a sealing member contacting a periphery of a surface of the substrate to seal a gap between the substrate and the substrate holder, and cleaning nozzles each configured to supply a jet of cleaning water to the substrate holder. The cleaning nozzles are disposed in the cleaning bath and arranged concentrically with a contact portion of the substrate surface contacting the sealing member and located at such positions that the jet of cleaning water impinges on the contact portion or its vicinity in an upper half of the substrate.

5 Claims, 15 Drawing Sheets

(56) References Cited

U.S. PATENT DOCUMENTS

| | | | |
|---|---|---|---|
| 2004/0094403 A1* | 5/2004 | Economikos | C25D 5/48 204/212 |
| 2004/0245112 A1* | 12/2004 | Sekimoto et al. | 205/133 |
| 2005/0227473 A1* | 10/2005 | Iiara | H01L 21/31111 438/607 |
| 2006/0000493 A1* | 1/2006 | Steger et al. | 134/33 |
| 2006/0113185 A1* | 6/2006 | Kuriyama | C23C 18/1628 204/275.1 |
| 2007/0224811 A1* | 9/2007 | Wang | H01L 21/288 438/678 |
| 2008/0302395 A1* | 12/2008 | Tanaka | 134/34 |
| 2012/0043200 A1* | 2/2012 | Fujikata et al. | 204/242 |

FOREIGN PATENT DOCUMENTS

| | | |
|---|---|---|
| JP | 62-160728 A | 7/1987 |
| JP | 2003-247098 A | 9/2003 |
| JP | 2004-076072 A | 3/2004 |
| JP | 2004-183042 A | 7/2004 |
| JP | 2008-121062 A | 5/2008 |
| TW | 200506104 A | 2/2005 |

* cited by examiner

SUBSTRATE CLEANING APPARATUS AND SUBSTRATE CLEANING METHOD

CROSS REFERENCE TO RELATED APPLICATIONS

This document claims priorities to Japanese Patent Application No. 2012-040239, filed on Feb. 27, 2012 and Japanese Patent Application No. 2013-032534, filed on Feb. 21, 2013, the entire contents of which are hereby incorporated by reference.

BACKGROUND OF THE INVENTION

Field of the Invention

The present invention relates to a substrate cleaning apparatus and a substrate cleaning method for use in a substrate processing apparatus, such as a plating apparatus for carrying out a sequence of plating steps on a surface of a substrate and drying the plated substrate, and more particularly to a substrate cleaning apparatus and a substrate cleaning method for cleaning a surface of a substrate held by a substrate holder with cleaning water, such as pure water, with a periphery of the substrate surface sealed by a sealing member after processing of the substrate, such as plating.

Description of the Related Art

The applicant has proposed a plating apparatus capable of successively forming bumps on a surface of a substrate, such as a semiconductor wafer. This plating apparatus includes a substrate holder for detachably holding the substrate by sandwiching it between a first holding member (base holding member) and a second holding member (movable holding member) while keeping a periphery of the substrate in pressure contact with an inner sealing member mounted to the second holding member and keeping the first holding member in pressure contact with an outer sealing member mounted to the second holding member so as to seal the contact portions. After plating of the surface of the substrate held by the substrate holder, the substrate surface is cleaned and dried while the substrate holder keeps holding the substrate (see Japanese Patent Laid-Open Publication No. 2003-247098).

This plating apparatus includes a water-cleaning bath (cleaning bath) as a substrate cleaning apparatus for cleaning the substrate after plating. The substrate held by the substrate holder is immersed in cleaning water, such as pure water, stored in the water-cleaning bath, so that the substrate and the substrate holder are cleaned simultaneously.

FIGS. 1A through 1E illustrate a sequence of cleaning processes according to a conventional typical substrate cleaning method for cleaning a substrate, such as a semiconductor wafer, together with the substrate holder by immersing the substrate held by the substrate holder in the cleaning water, such as pure water, in the cleaning bath.

First, as shown in FIG. 1A, a substrate holder 204 holding a substrate is lowered toward a cleaning bath 200 filled with cleaning water 202, such as pure water, and as shown in FIG. 1B the substrate held by the substrate holder 204 is immersed in the cleaning water 202 retained in the cleaning bath 200, so that the substrate and the substrate holder 204 in their entirety are cleaned with the cleaning water 202. This cleaning process is basically a process of removing a liquid chemical, adhering to the substrate and the substrate holder 204, by diffusion due to a difference in concentration of liquid.

Next, as shown in FIG. 1C, the cleaning water 202 into which the liquid chemical has been diffused through the cleaning process is discharged from the cleaning bath 200. Thereafter, as shown in FIG. 1D, fresh cleaning water 202 is supplied into the cleaning bath 200 to clean the substrate and the substrate holder 204 in their entirety. Such QDR (quick dump rinse) cleaning may be repeated multiple times, e.g., two or three times, as needed.

Next, as shown in FIG. 1E, the substrate holder 204 together with the substrate is pulled up from the cleaning water 202 to terminate the cleaning process. The lower a speed at which the substrate holder 204 is pulled up, the smaller is an amount of the cleaning water adhering to the substrate holder 204 and the substrate, leading to less contamination by e.g., a plating solution in the next process. The cleaning water 202 remaining in the cleaning bath 200 may be reused for cleaning the next substrate in order to reduce the amount of cleaning water (pure water) used.

There has been proposed a cleaning apparatus configured to clean a semiconductor wafer by supplying a jet of pure water to the semiconductor wafer through shower nozzles provided at a top portion and a side portion of a water-cleaning bath while discharging the supplied pure water from the water-cleaning bath, and subsequently supplying pure water into the water-cleaning bath to clean the semiconductor wafer (see Japanese Patent Laid-Open Publication No. S61-61425). There has also been proposed a cleaning apparatus configured to clean a semiconductor wafer by supplying a jet of pure water to the semiconductor wafer through shower nozzles provided at a top portion and a bottom portion of a water-cleaning bath while discharging the supplied pure water from the water-cleaning bath (see Japanese Patent Laid-Open Publication No. S62-160728).

In the conventional QDR method of cleaning the substrate surface with pure water immediately after plating, if the number of QDR cleaning operations is small, uneven drying (uneven oxidation) of the substrate surface can occur upon drying of the substrate. Such uneven drying of the substrate surface is caused by a high concentration of the plating solution contained in the cleaning water remaining on the substrate. Thus, if the concentration of the plating solution in the cleaning water is low, uneven drying of the substrate surface will not occur. The cleaning water remaining on the substrate is one that comes from the cleaning bath.

Therefore, in the conventional QDR cleaning method, it is necessary to lower the concentration of the plating solution in the cleaning water stored in the cleaning bath when cleaning the substrate with the cleaning water. As a result, the number of QDR cleaning operations is increased, resulting in an increased amount of cleaning water (pure water) used.

Furthermore, when the substrate is held by the substrate holder while sealing a periphery of the surface of the substrate with a sealing member, a continuous annular recess may be formed on a contact portion $D_1$ (see FIG. 6) in the periphery of the substrate surface contacting the sealing member. In the conventional QDR cleaning method in which convection of the cleaning water in the cleaning bath is less likely to occur, the plating solution, adhering to the recess formed on the contact portion $D_1$, is less diffused. As a result, it is difficult to remove the plating solution from the peripheral contact portion $D_1$. In order to uniformly clean the entire surface, including the periphery, of the substrate, it is necessary to further increase the number of QDR cleaning operations.

The difficulty in cleaning the contact portion in the periphery of the substrate surface contacting the sealing member is also encountered when cleaning the substrate by supplying a jet of cleaning water from the cleaning nozzle (shower nozzle) to the substrate surface. In order to uniformly clean the entire surface including the periphery of the substrate without causing uneven drying, it is considered necessary to increase a flow rate of the jet of cleaning water.

SUMMARY OF THE INVENTION

The present invention has been made in view of the above situation. It is therefore an object of the present invention to provide a substrate cleaning apparatus and a substrate cleaning method which can uniformly clean an entire surface, including a periphery, of a substrate without increasing an amount of cleaning water, such as pure water, even when the substrate is held by a substrate holder with a sealing member contacting the periphery of the substrate surface to seal a gap between the substrate and the substrate holder.

In order to achieve the object, the present invention provides a substrate cleaning apparatus including a cleaning bath in which a substrate holder holding a substrate is disposed in a vertical position, the substrate holder having a sealing member contacting a periphery of a surface of the substrate to seal a gap between the substrate and the substrate holder; and cleaning nozzles each configured to supply a jet of cleaning water to the substrate holder, the cleaning nozzles being disposed in the cleaning bath and arranged concentrically with a contact portion of the substrate surface contacting the sealing member and located at such positions that the jet of cleaning water impinges on the contact portion or its vicinity in an upper half of the substrate.

Since the jet of cleaning water impinges on the contact portion or its vicinity in the upper half of the vertically disposed substrate, the contact portion can be effectively cleaned with the cleaning water which impinges on the contact portion either directly or indirectly after bouncing off the substrate, and can be further cleaned with the cleaning water flowing down along the contact portion. In addition, the entire surface of the substrate can be cleaned with the cleaning water vertically flowing down on the surface of the substrate.

In a preferred aspect of the present invention, the cleaning nozzles lie in an X-Y plane defined by a horizontal X-axis and a vertical Y-axis and having an origin corresponding to a center of the substrate; the cleaning nozzles comprise an uppermost cleaning nozzle lying on the Y-axis, at least one pair of upper cleaning nozzles which are symmetrical with respect to the Y-axis, and a pair of intermediate cleaning nozzles lying on the X-axis; the upper cleaning nozzles are located between the uppermost cleaning nozzle and the intermediate cleaning nozzles; and an angle between lines connecting the origin to adjacent two of the cleaning nozzles increases gradually as a distance from the Y-axis to the adjacent two of the cleaning nozzles increases.

The above arrangement can equalize distances between the adjacent cleaning nozzles along the X-axis. Therefore, the cleaning water can thus uniformly disperse throughout the surface of the substrate, while flowing down vertically on the surface of the substrate.

In a preferred aspect of the present invention, the substrate cleaning apparatus further includes lower cleaning nozzles arranged concentrically with the contact portion of the substrate surface and located at such positions that a jet of cleaning water, supplied from each lower cleaning nozzle, impinges on the contact portion or its vicinity in a lower half of the substrate.

The lower cleaning nozzles thus arranged can further enhance the cleaning effect of the contact portion of the periphery of the substrate.

In a preferred aspect of the present invention, each of the cleaning nozzles is a fan nozzle configured to cause the jet of cleaning water to spread laterally and linearly along the contact portion.

With this type of nozzle, the jet of cleaning water can impinge on a wider area on the contact portion or its vicinity and can flow down on the surface of the substrate in the vertical direction.

In a preferred aspect of the present invention, the sealing member comprises a first sealing member; and the apparatus further comprises holder cleaning nozzles arranged concentrically with a second sealing member for sealing a gap between holding members of the substrate holder, the holder cleaning nozzles being located at such positions that a jet of cleaning water, supplied from each holder cleaning nozzle, impinges on the second sealing member or its vicinity.

The second sealing member can be effectively cleaned with the cleaning water which impinges on the second sealing member or its vicinity, and can be further cleaned with the cleaning water flowing down along the second sealing member.

Another aspect of the present invention provides a substrate cleaning method including: immersing a substrate holder, holding a substrate, in cleaning water retained in a cleaning bath with a sealing member contacting a periphery of a surface of the substrate to seal a gap between the substrate holder and the substrate; discharging the cleaning water from the cleaning bath; supplying jet of cleaning water from cleaning nozzles to the substrate such that the jet of cleaning water impinges on a contact portion, or its vicinity, of the substrate surface contacting the sealing member, while discharging the cleaning water, supplied from the cleaning nozzles, from the cleaning bath; supplying the cleaning water through the cleaning nozzles into the cleaning bath to cause the substrate holder to be immersed in the cleaning water; and pulling up the substrate holder from the cleaning bath.

In a preferred aspect of the present invention, the sealing member comprises a first sealing member; and supplying the jet of cleaning water comprises supplying jet of cleaning water from cleaning nozzles to the substrate such that the jet of cleaning water impinges on a contact portion, or its vicinity, of the substrate surface contacting the first sealing member and supplying jet of cleaning water from holder cleaning nozzles to the substrate holder such that the jet of cleaning water impinges on a second sealing member, or its vicinity, arranged so as to seal a gap between holding members of the substrate holder, while discharging the cleaning water, supplied from the cleaning nozzles and the holder cleaning nozzles, from the cleaning bath.

Still another aspect of the present invention provides a substrate cleaning method including: placing a substrate holder, holding a substrate, in a cleaning bath with a sealing member contacting a periphery of a surface of the substrate to seal a gap between the substrate holder and the substrate; performing a first process of supplying jet of cleaning water from cleaning nozzles to the substrate such that the jet of cleaning water impinges on a contact portion, or its vicinity, of the substrate surface contacting the sealing member, while discharging the cleaning water, supplied from the cleaning nozzles, from the cleaning bath; supplying the cleaning water through the cleaning nozzles into the cleaning bath to cause the substrate holder to be immersed in the cleaning water; discharging the cleaning water from the cleaning bath; performing a second process of supplying jet of cleaning water from the cleaning nozzles to the substrate such that the jet of cleaning water impinges on the contact portion or its vicinity, while discharging the cleaning water, supplied from the cleaning nozzles, from the cleaning bath; and pulling up the substrate holder from the cleaning bath.

In a preferred aspect of the present invention, performing the first process comprises performing a first process of supplying jet of cleaning water from cleaning nozzles to the substrate such that the jet of cleaning water impinges on a contact portion, or its vicinity, of the substrate surface contacting the sealing member and supplying jet of cleaning water from holder cleaning nozzles to the substrate holder such that the jet of cleaning water impinges on a second sealing member, or its vicinity, arranged so as to seal a gap between holding members of the substrate holder, while discharging the cleaning water, supplied from the cleaning nozzles and the holder cleaning nozzles, from the cleaning bath; and performing the second process comprises performing a second process of supplying jet of cleaning water from the cleaning nozzles to the substrate such that the jet of cleaning water impinges on the contact portion or its vicinity and supplying jet of cleaning water from the holder cleaning nozzles to the substrate holder such that the jet of cleaning water impinges on the second sealing member or its vicinity, while discharging the cleaning water, supplied from the cleaning nozzles and the holder cleaning nozzles, from the cleaning bath.

According to the present invention, the contact portion of the periphery of the substrate can be effectively cleaned with the cleaning water which impinges on the contact portion either directly or indirectly, and can be further cleaned with the cleaning water flowing downward along the contact portion. In addition, the entire surface of the substrate can be cleaned with the cleaning water flowing down vertically on the surface of the substrate. Therefore, the entire surface, including the periphery, of the substrate can be cleaned uniformly without increasing an amount of cleaning water, such as pure water.

DETAILED DESCRIPTION OF THE PREFERRED EMBODIMENTS

Preferred embodiments of the present invention will now be described in detail with reference to FIGS. 2 through 16. The following descriptions illustrate embodiments of the present invention as applied to a substrate cleaning apparatus for cleaning a substrate after plating provided in a plating apparatus for performing a sequence of plating processes on a substrate surface. The present invention may, of course, be applied to a substrate cleaning apparatus provided in any other type of substrate processing apparatus in which a substrate is processed with a chemical, and then cleaned and dried.

Figure 2:
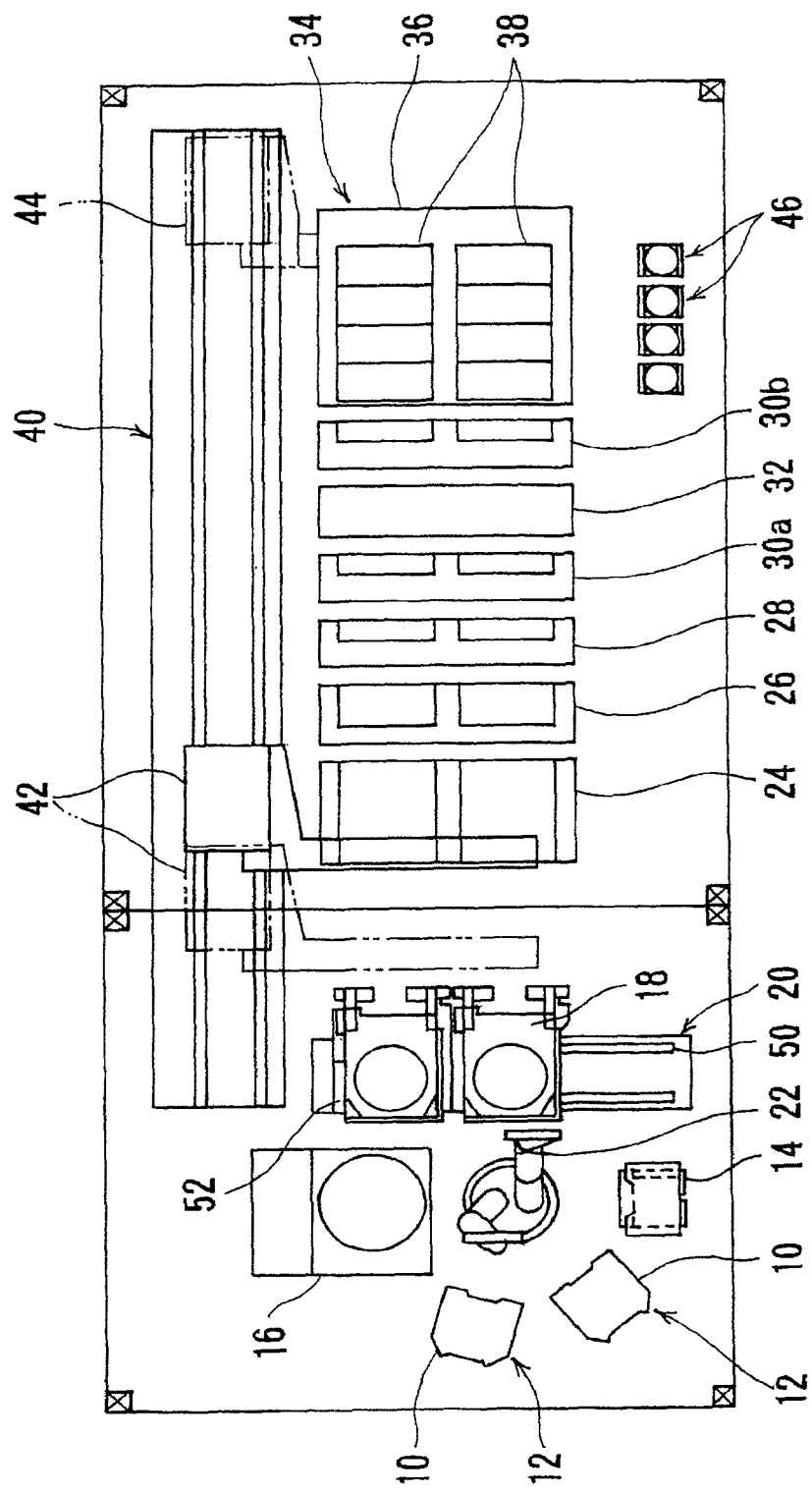
FIG. 2 is an overall layout plan view of a plating apparatus provided with a substrate cleaning apparatus according to an embodiment of the present invention.
Figure 3:
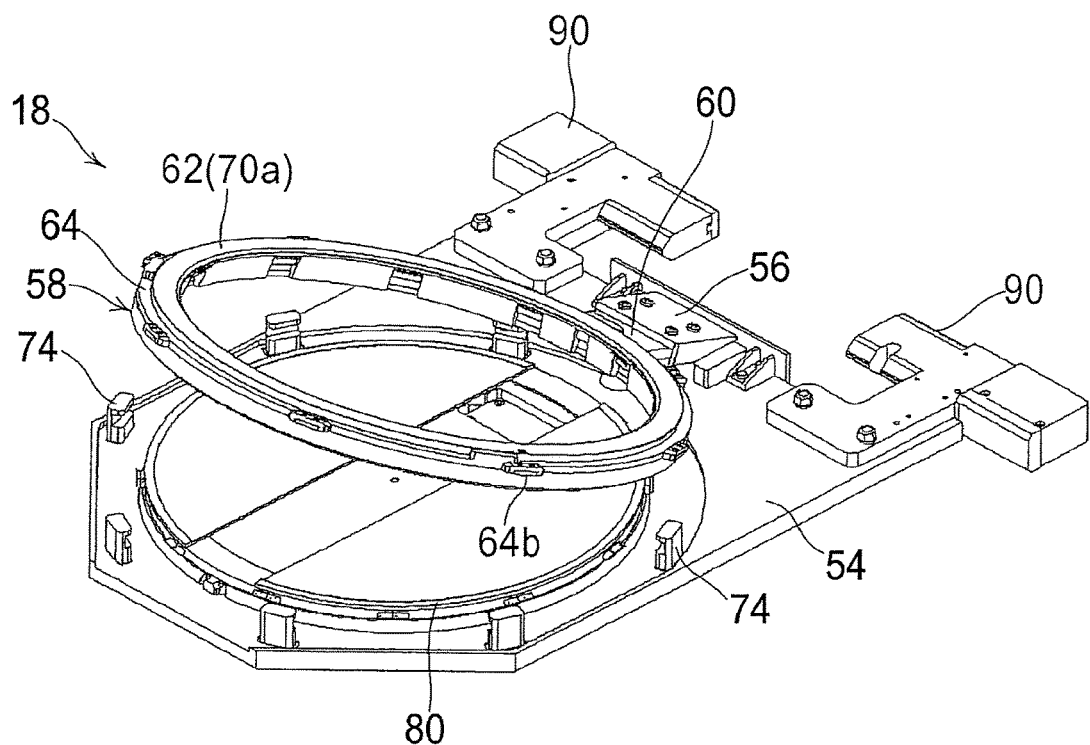
FIG. 3 is a schematic perspective view of a substrate holder shown in FIG. 2.

FIG. 2 shows an overall layout plan of a plating apparatus provided with a substrate cleaning apparatus according to an embodiment of the present invention. As shown in FIG. 2, the plating apparatus includes two cassette tables 12 each receives thereon a cassette 10 in which substrates W, such as semiconductor wafers, are housed, an aligner 14 for aligning an orientation flat or a notch of the substrate W in a predetermined direction, and a spin drier 16 for drying the substrate W after plating by rotating it at a high speed. Near these units is provided a substrate attachment and detachment unit 20 for attaching and detaching the substrate W to and from the substrate holder 18 placed thereon. Further, in the center of these units is disposed a substrate transport device 22 which is a transport robot for transporting the substrate W between these units.

Figure 1:
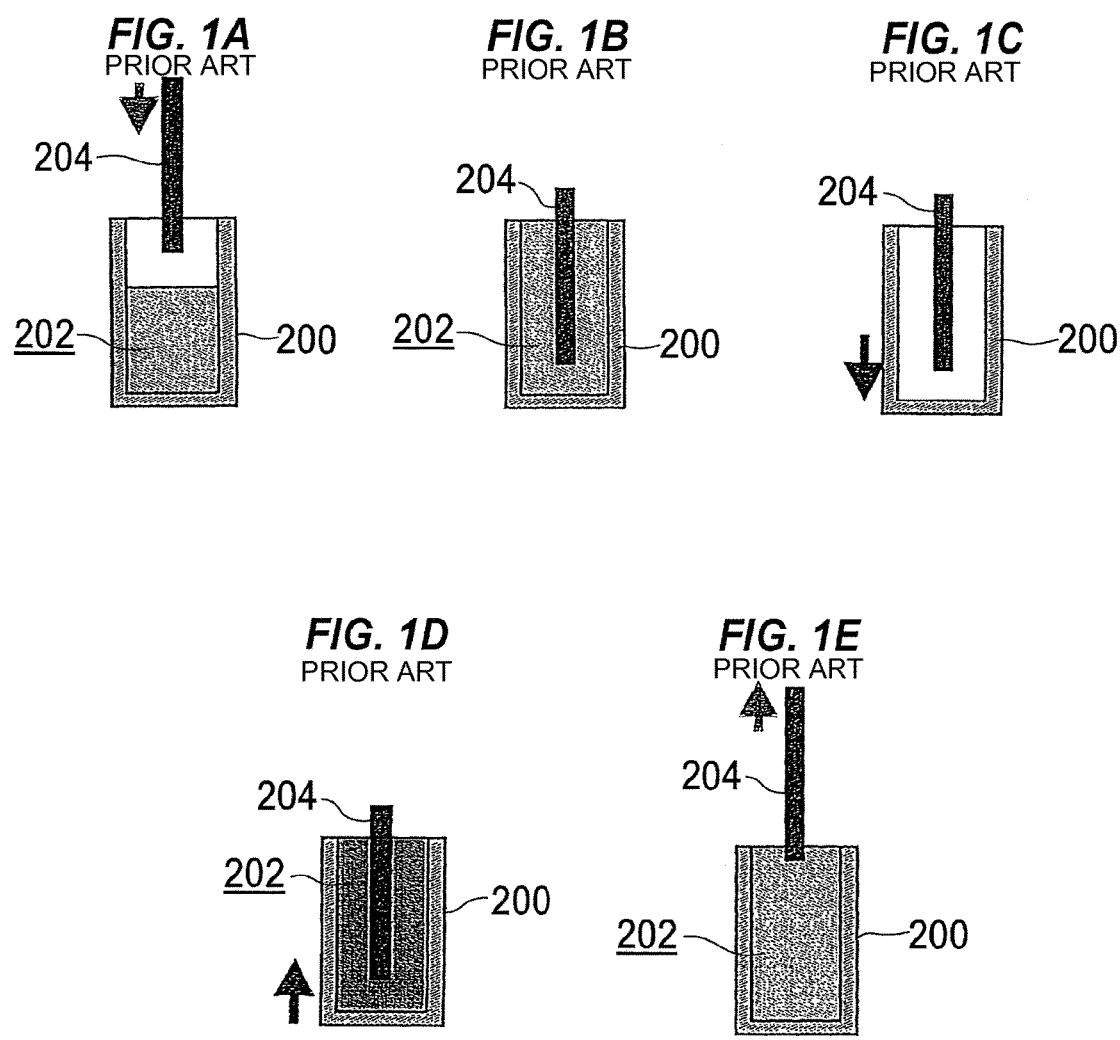
FIGS. 1A, 1B, 1C, 1D, and 1E are diagrams illustrating a sequence of cleaning processes according to a conventional substrate cleaning method.

The plating apparatus further includes a stock unit 24 for storing (and temporarily storing) substrate holders 18 therein, a pre-wetting bath 26 for immersing the substrate W in pure water, a pre-soaking bath 28 for etching away an oxide film formed on a surface of a film (e.g., a seed layer) of the substrate W, a water-cleaning bath 30a for cleaning the surface of the pre-soaked substrate W according to the cleaning method shown in FIG. 1, a blow bath 32 for draining the substrate W after cleaning, a plating bath 34 for plating the substrate W, and a substrate cleaning apparatus 30b for cleaning the plated substrate W according to an embodiment of the present invention. These bathes and units are arranged in this order from the substrate attachment and detachment unit side. The plating bath 34 includes an overflow bath 36 and a plurality of plating units 38 housed in the overflow bath 36. Each plating unit 38 is configured to receive one substrate W therein and perform plating, e.g., copper plating, on the surface of the substrate W. Although copper plating is performed in this embodiment, it is also possible to plate the substrate W with nickel, solder, silver, or gold.

The plating apparatus further includes a substrate holder transport device 40, driven e.g., by a linear motor, for transporting the substrate holder 18, together with the substrate W, between the above-described bathes and units. This substrate holder transport device 40 is arranged beside these bathes and units. The substrate holder transport device 40 has a first transporter 42 for transporting the substrate W between the substrate attachment and detachment unit 20 and the stock unit 24, and a second transporter 44 for transporting the substrate W between the stock unit 24, the pre-wetting bath 26, the pre-soaking bath 28, the water-cleaning bath 30*a*, the substrate cleaning apparatus 30*b*, the blow bath 32, and the plating bath 34. The substrate holder transport device 40 may include only the first transporter 42 without being provided with the second transporter 44.

Paddle drive devices 46 are provided each for driving a paddle (not shown) disposed in each plating unit 38 as an agitator for agitating a plating solution. The paddle drive devices 46 are located next to the overflow bath 36 at the opposite side of the substrate holder transport device 40.

The substrate attachment and detachment unit 20 includes a flat stage plate 52 which is laterally slidable along rails 50. Two substrate holders 18, parallel to each other, are placed horizontally on the stage plate 52. After the substrate W is transferred between one substrate holder 18 and the substrate transport device 22, the stage plate 52 is slid laterally and other substrate W is transferred between the other substrate holder 18 and the substrate transport device 22.

As shown in FIGS. 3 through 6, the substrate holder 18 includes a first holding member (base holding member) 54 having a rectangular plate shape and made of e.g., vinyl chloride, and a second holding member (movable holding member) 58 rotatably coupled to the first holding member 54 through a hinge 56 which allows the second holding member 58 to open and close with respect to the first holding member 54. Although in this embodiment the second holding member 58 is configured to be openable and closable through the hinge 56, it is also possible to dispose the second holding member 58 opposite to the first holding member 54 and to move the second holding member 58 away from and toward the first holding member 54 to thereby open and close the second holding member 58.

The second holding member 58 includes a base portion 60 and a ring-shaped seal holder 62. The seal holder 62 is made of vinyl chloride so as to enable a retaining ring 64, which will be described later, to slide well. An inwardly-projecting inner sealing member 66 is fixed to an upper surface of the seal holder 62. This seal holder 62 is placed in pressure contact with a periphery of the surface of the substrate W to seal a gap between the substrate W and the second holding member 58 when the substrate W is held by the substrate holder 18. An outer sealing member 68 is fixed to a surface, facing the first holding member 54, of the seal holder 62. This outer sealing member 68 is placed in pressure contact with the first holding member 54 to seal a gap between the first holding member 54 and the second holding member 58. The outer sealing member 68 is located outwardly of the inner sealing member 66.

Figure 6:
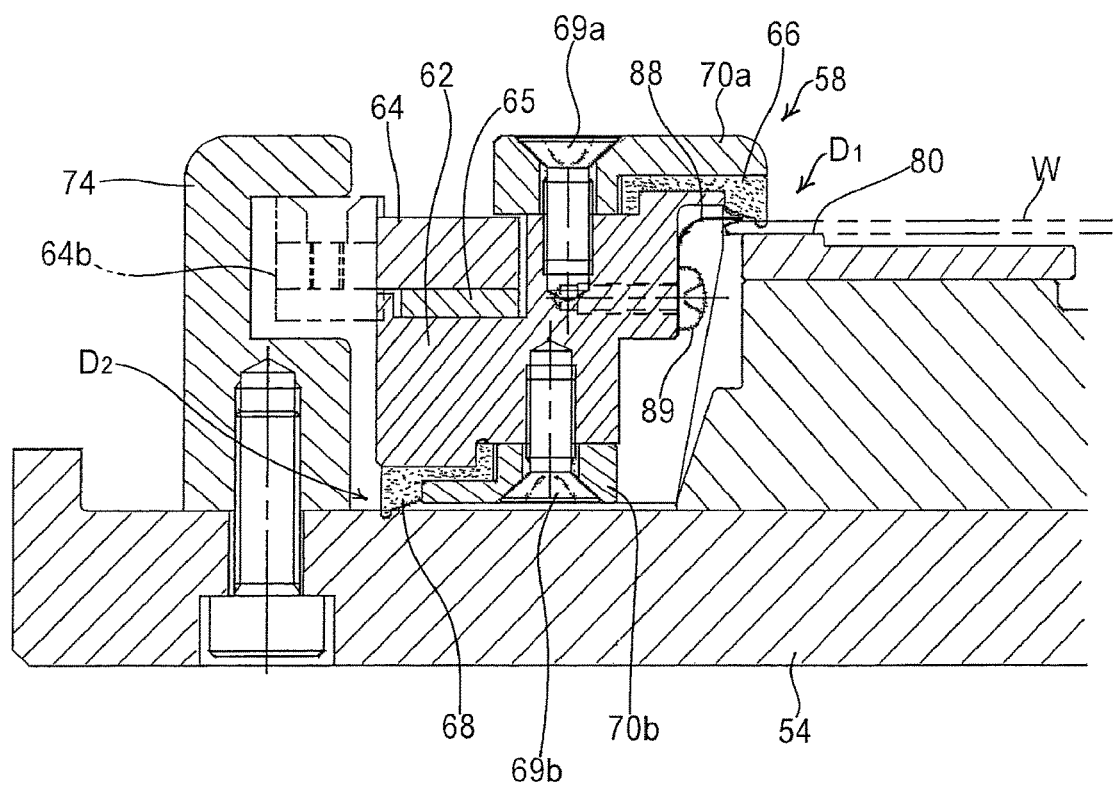
FIG. 6 is an enlarged view of a part of the substrate holder indicated by a symbol A in FIG. 5.

As shown in FIG. 6, the inner sealing member 66 is sandwiched between the seal holder 62 and a first mounting ring 70*a* which is secured to the seal holder 62 by fastening tools 69*a*, such as bolts. The outer sealing member 68 is sandwiched between the seal holder 62 and a second mounting ring 70*b* which is secured to the seal holder 62 by fastening tools 69*b*, such as bolts.

The seal holder 62 of the second holding member 58 has a stepped portion at a periphery thereof, and the retaining ring 64 is rotatably mounted to the stepped portion via a spacer 65. The retaining ring 64 is inescapably held by an outwardly projecting retaining plates 72 (see FIG. 4) mounted to a side surface of the seal holder 62. This retaining ring 64 is made of a material having high rigidity and excellent acid corrosion resistance, for example titanium, and the spacer 65 is made of a material having a low friction coefficient, for example PTEF, so that the retaining ring 64 can rotate smoothly.

Inverted L-shaped clampers 74, each having an inwardly projecting portion and located outside of the retaining ring 64, are provided on the first holding member 54 at equal intervals along a circumferential direction of the retaining ring 64. Outwardly projecting portions 64*b* are provided on the retaining ring 64 along the circumferential direction of the retaining ring 64 at positions corresponding to positions of the clampers 74. A lower surface of the inwardly projecting portion of each clamper 74 and an upper surface of each projecting portion 64*b* of the retaining ring 64 are tapered in opposite directions along the rotational direction of the retaining ring 64. A plurality (e.g., four) of upwardly protruding dots 64*a* are provided on the retaining ring 64 in predetermined positions along the circumferential direction of the retaining ring 64. The retaining ring 64 can be rotated by pushing and moving each dot 64*a* from a lateral direction by means of a rotating pin (not shown).

When the second holding member 58 is open, the substrate W is inserted into the central portion of the first holding member 54, and the second holding member 58 is then closed through the hinge 56. Subsequently the retaining ring 64 is rotated clockwise so that each projecting portion 64*b* of the retaining ring 64 slides into the inwardly projecting portion of each clamper 74. As a result, the first holding member 54 and the second holding member 58 are fastened to each other and locked by engagement between the tapered surfaces of the projecting portions 64*b* of the retaining ring 64 and the tapered surfaces of the clampers 74. The lock can be released by rotating the retaining ring 64 counterclockwise and withdrawing the projecting portions 64*b* of the retaining ring 64 from the inwardly projecting portions of the clampers 74. When the second holding member 58 is locked in the above-described manner, the lower end of the inner downwardly-protruding portion of the inner sealing member 66 is placed in pressure contact with the periphery of the surface of the substrate W held by the substrate holder 18, while the lower end of the outer downwardly-protruding portion of the outer sealing member 68 is placed in pressure contact with the surface of the first holding member 54, whereby the sealing members 66 and 68 are uniformly pressed to seal the gap between the substrate W and the second holding member 58 and the gap between the first holding member 54 and the second holding member 58, respectively.

When the inner sealing member 66 is pressed against the periphery of the surface of the substrate W, a continuous annular recess may be formed between the surface of the substrate W and an inner circumferential surface of the inner sealing member 66. This recess extends along the contact portion $D_1$ in the periphery of the substrate surface contacting the inner sealing member 66. Likewise, a continuous annular recess is formed between the first holding member 54 and an outer circumferential surface of the outer sealing member 68 along the outer contact portion $D_2$ of the outer sealing member 68 contacting the first holding member 54.

A protruding portion 82 is formed on the first holding member 54 so as to protrude in a ring shape corresponding to a size of the substrate W. The protruding portion 82 has a support surface 80 which is placed in contact with the periphery of the substrate W to support the substrate W. The protruding portion 82 has recesses 84 arranged at predetermined positions along a circumferential direction of the protruding portion 82.

Figure 4:
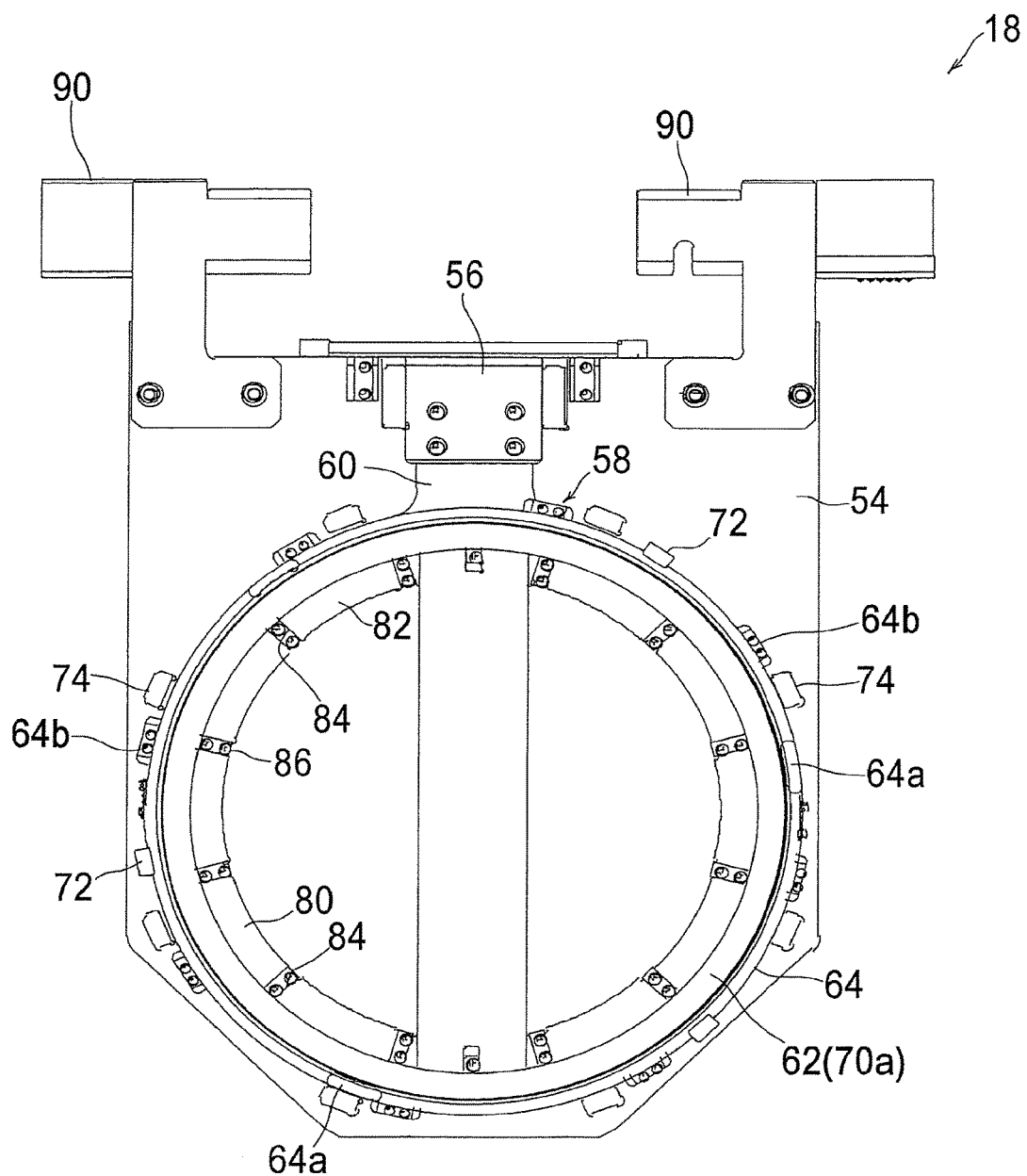
FIG. 4 is a plan view of the substrate holder shown in FIG. 2.
Figure 5:
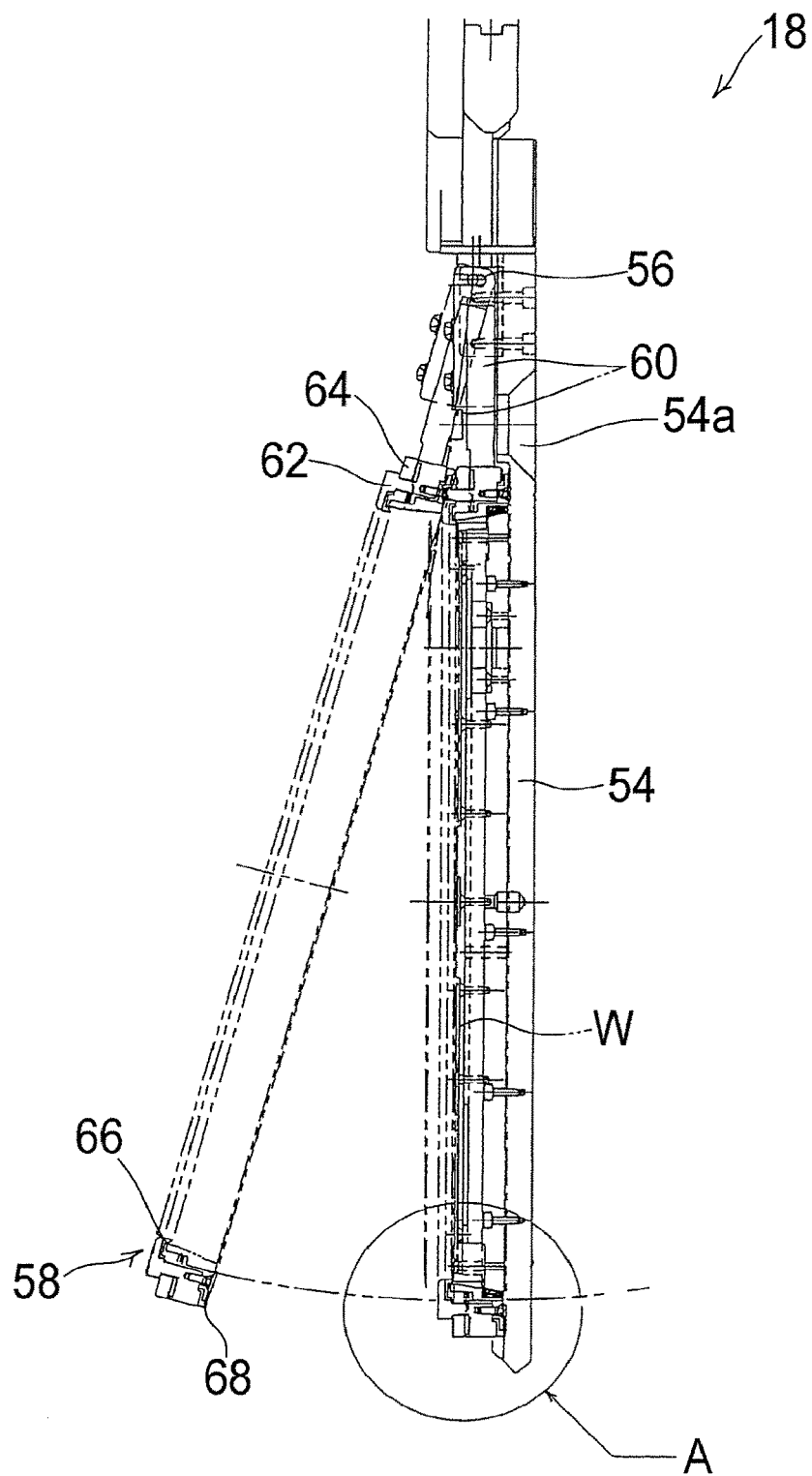
FIG. 5 is a right side view of the substrate holder shown in FIG. 2.

As shown in FIG. 4, a plurality of electrical conductors (electrical contacts) 86 (e.g., 12 conductors as illustrated), connected respectively to wires extending from external contacts provided in a hand 90, are disposed in the recesses 84 of the protruding portion 82. When the substrate W is placed on the support surface 80 of the first holding member 54, ends of the electrical conductors 86 are exposed in a springy state on the surface of the first holding member 54 at positions beside the substrate W to contact lower portions of the electrical contacts 88 shown in FIG. 6.

The electrical contacts 88, to be electrically connected to the electrical conductors 86, are secured to the seal holder 62 of the second holding member 58 by fastening tools 89, such as bolts. The electrical contacts 88 each have a leaf spring-like contact portion lying outside the inner sealing member 66 and projecting inwardly. This contact portion is springy and bends easily. When the substrate W is held by the first holding member 54 and the second holding member 58, the contact portions of the electrical contacts 88 make elastic contact with the peripheral surface of the substrate W supported on the support surface 80 of the first holding member 54.

The second holding member 58 is opened and closed by a not-shown cylinder and by the weight of the second holding member 58 itself. More specifically, a through-hole 54a is formed in the first holding member 54, and a pneumatic cylinder is provided so as to face the through-hole 54a when the substrate holder 18 is placed on the stage plate 52. The second holding member 58 is opened by extending a cylinder rod of the pneumatic cylinder to lift up a pressing rod through the through-hole 54a to thereby push up the seal holder 62 of the second holding member 58. The second holding member 58 is closed by its own weight when the cylinder rod is retracted.

A pair of approximately T-shaped hands 90 is coupled to the end of the first holding member 54 of the substrate holder 18. These hands 90 serve as a support when the substrate holder 18 is transported and when the substrate holder 18 is held in a suspended state. In the stock unit 24, outwardly projecting portions of the hands 90 are placed on an upper surface of a peripheral wall of the stock unit 24, whereby the substrate holder 18 is suspended in a vertical position. When transporting the substrate holder 18 from the stock unit 24, the hands 90 of the suspended substrate holder 18 are gripped by the transporter 42 of the substrate holder transport device 40. Also in the pre-wetting bath 26, the pre-soaking bath 28, the water-cleaning bath 30a, the substrate cleaning apparatus 30b, the blow bath 32, and the plating bath 34, the substrate holder 18 is held in a suspended state with the hands 90 placed on top of peripheral wall of the bath.

Figure 7:
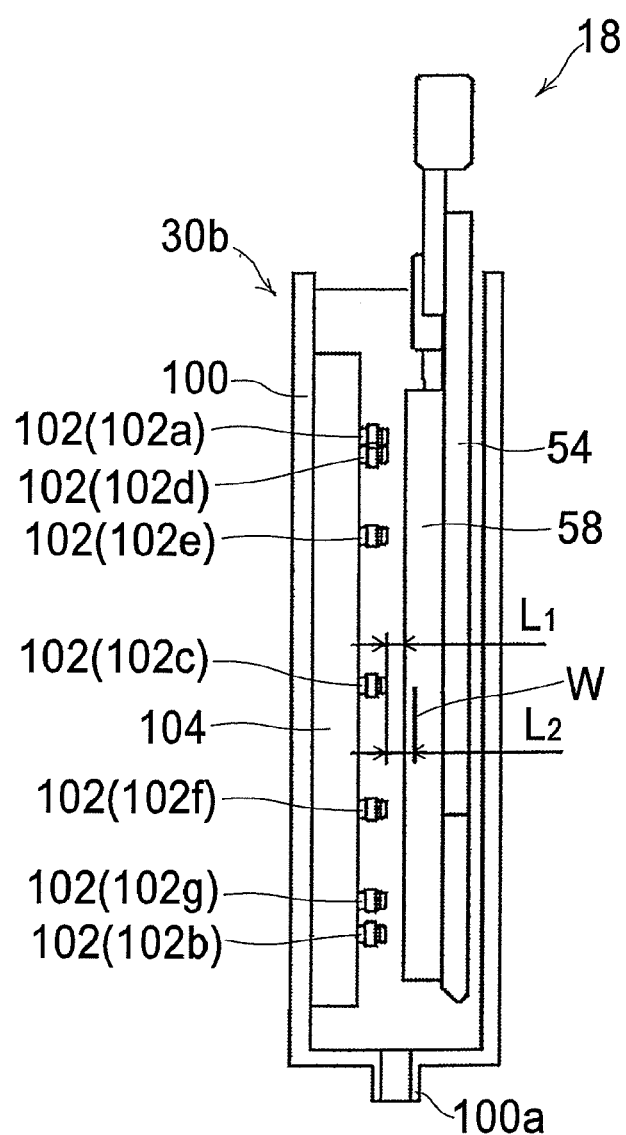
FIG. 7 is a vertical cross-sectional front view schematically illustrating the substrate cleaning apparatus shown in FIG. 2 together with the substrate holder holding a substrate.

FIG. 7 is a vertical cross-sectional front view schematically illustrating the substrate cleaning apparatus 30b according to the embodiment of the present invention together with the substrate holder 18 holding the substrate W. As shown in FIG. 7, the substrate cleaning apparatus 30b includes an open-top cleaning bath 100 having a discharge outlet 100a in its bottom. The substrate holder 18 is held in a vertically-suspended state on top of a peripheral wall of the cleaning bath 100 and disposed at a predetermined position in the cleaning bath 100. In the cleaning bath 100, a plurality of cleaning nozzles 102 each for supplying a jet of cleaning water, such as pure water, to the substrate holder 18 are disposed so as to face the substrate holder 18. These cleaning nozzles 102 are arranged concentrically with the contact portion $D_1$ in the periphery of the surface of the substrate W at such positions that the jet of cleaning water impinges on the contact portion $D_1$ or its vicinity. Thus, in order to remove the plating solution adhering to the contact portion $D_1$ or its vicinity, the cleaning nozzles 102 are arranged at positions such that a jet S (see FIG. 9) of cleaning liquid, ejected from each cleaning nozzle 102, impinges directly on the contact portion $D_1$, or impinges on the substrate W once and then spreads outward on the substrate surface to impinge on the contact portion $D_1$ in a direction approximately parallel to the substrate W.

In this embodiment the cleaning nozzles 102 are secured to a nozzle plate 104, which is disposed concentrically with the contact portion $D_1$ and secured to an inner surface of the peripheral wall of the cleaning bath 100. The cleaning nozzles 102 may be secured directly to the inner surface of the peripheral wall of the cleaning bath 100. The cleaning nozzles 102 may be disposed radially inwardly of the contact portion $D_1$. In this case, the cleaning nozzles 102 may each be inclined with respect to a horizontal plane such that the jet of cleaning water directly impinges on the contact portion $D_1$. This arrangement can produce a higher cleaning effect.

Figure 9:
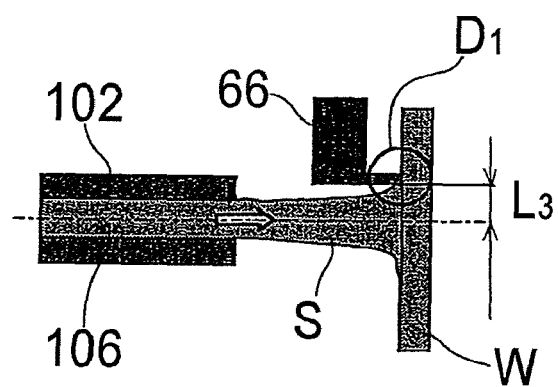
FIG. 9 is a diagram illustrating a positional relationship between a jet of cleaning water ejected from a cleaning nozzle and a contact portion in a periphery of a substrate surface contacting a sealing member.

As shown in FIG. 7, in this embodiment a distance $L_1$ between a front end of each cleaning nozzle 102 and the substrate holder 18 is set at 9 mm ($L_1$=9 mm), and a distance $L_2$ between the front end of each cleaning nozzle 102 and the substrate W held by the substrate holder 18 is set at 15 mm ($L_2$=15 mm). Further, as shown in FIG. 9, a distance $L_3$ between a central axis of each cleaning nozzle 102 and the contact portion $D_1$ of the substrate W contacting the inner sealing member 66 is set at about 1 mm to 6 mm, e.g., 3 mm ($L_3$=3 mm). With this arrangement of the cleaning nozzles 102, the jet S of cleaning water 106, ejected from each cleaning nozzle 102, impinges directly on the contact portion $D_1$, or impinges on the substrate W once and spreads outward on the substrate surface to impinge on the contact portion $D_1$ in a direction approximately parallel to the substrate W.

Figure 8:
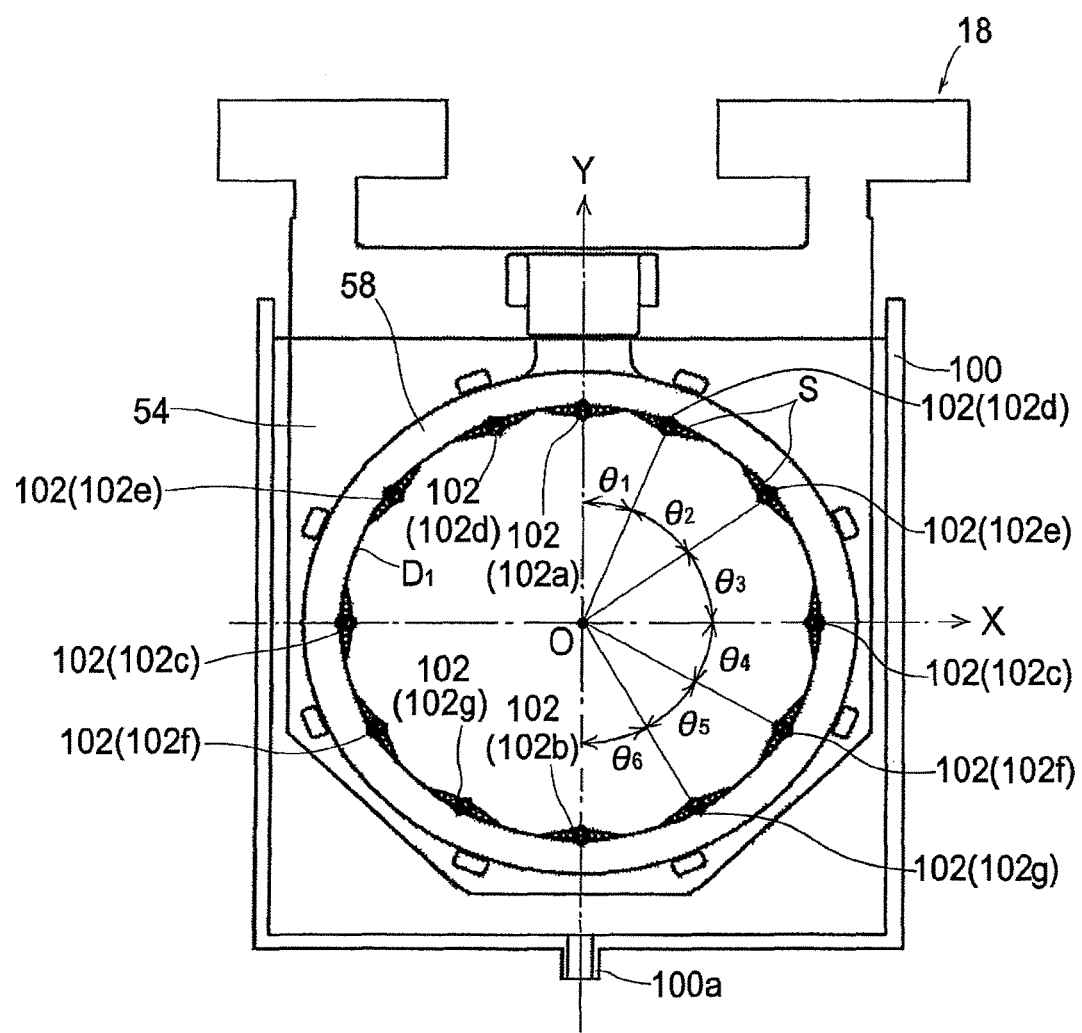
FIG. 8 is a diagram illustrating a positional relationship between the substrate holder disposed in a predetermined position in a cleaning bath and cleaning nozzles secured to a nozzle plate.

As shown in FIG. 8, in this embodiment a total of 12 cleaning nozzles 102 are installed on the nozzle plate 104. More specifically, the cleaning nozzles 102 lie in an X-Y plane, which is defined by a horizontal X-axis and a vertical Y-axis and has an origin O corresponding to the center of the substrate W. An uppermost cleaning nozzle 102a and a lowermost cleaning nozzle 102b lie on the Y-axis. A pair of intermediate cleaning nozzles 102c lies on the X-axis. A pair of first upper cleaning nozzles 102d and a pair of second upper cleaning nozzles 102e (a total of 4 nozzles), each pair being symmetrical with respect to the Y-axis, lie between the uppermost cleaning nozzle 102a and the intermediate cleaning nozzles 102c. A pair of first lower cleaning nozzles 102f and a pair of second lower cleaning nozzles 102g (a total of 4 nozzles), each pair being symmetrical with respect to the Y-axis, lie between the lowermost cleaning nozzle 102b and the intermediate cleaning nozzles 102c.

The lowermost cleaning nozzle 102b, the first and second lower cleaning nozzles 102f, 102g, and the intermediate cleaning nozzles 102c are not indispensable, but are provided so as to increase the effect of cleaning the contact portion $D_1$ in the periphery of the substrate surface contacting the inner sealing member 66.

In this embodiment, angles $\theta_1$, $\theta_2$, and $\theta_3$ satisfy an inequality $\theta_1 < \theta_2 < \theta_3$, where $\theta_1$ is an angle between the Y-axis and a line connecting the origin O to the first upper cleaning nozzle 102d, $\theta_2$ is an angle between the line connecting the origin O to the first upper cleaning nozzle 102d and a line connecting the origin O to the second upper cleaning nozzle 102e, and $\theta_3$ is an angle between the X-axis and the line connecting the origin O and the second upper cleaning nozzle 102e. The angle $\theta_2$ is larger than the angle $\theta_1$, and the angle $\theta_3$ is larger than the angle $\theta_2$. For example, the angle $\theta_1$ is set at 22° ($\theta_1 = 22°$), the angle $\theta_2$ is set at 31° ($\theta_2 = 31°$), and the angle $\theta_3$ is set at 37° ($\theta_3 = 37°$). In this manner, the angles $\theta_1$, $\theta_2$, and $\theta_3$ increase gradually. That is, the angle between lines connecting the origin O to adjacent two of the cleaning nozzles 102 increases gradually as a distance from the Y-axis to the adjacent two of the cleaning nozzles 102 increases.

The above angular relationship between the cleaning nozzles 102 approximately equalizes distances between the adjacent cleaning nozzles 102 along the X-axis. More specifically, a distance between the uppermost cleaning nozzle 102a and the first upper cleaning nozzle 102d in the X-axis direction, a distance between the first upper cleaning nozzle 102d and the adjacent second upper cleaning nozzle 102e in the X-axis direction, and a distance between the second upper cleaning nozzle 102e and the adjacent intermediate cleaning nozzle 102c in the X-axis direction are approximately equal to each other. Therefore, the cleaning water, ejected from the cleaning nozzles 102a, 102d, and 102e, vertically flows down on the surface of the substrate W to cover surface areas having substantially the same widths in the X-axis direction. The cleaning water can thus uniformly disperse throughout the surface of the substrate W.

Angles $\theta_4$, $\theta_5$, and $\theta_6$ satisfy an equality $\theta_4 = \theta_5 = \theta_6$, where $\theta_4$ is an angle between the X-axis and a line connecting the origin O to the first lower cleaning nozzle 102f, $\theta_5$ is an angle between the line connecting the origin O to the first lower cleaning nozzle 102f and a line connecting the origin O to the adjacent second lower cleaning nozzle 102g, and $\theta_6$ is an angle between the Y-axis and the line connecting the origin O to the second lower cleaning nozzle 102g. These angles $\theta_4$, $\theta_5$, and $\theta_6$ are set to be equal to each other. For example, the angles $\theta_4$, $\theta_5$, and $\theta_6$ are all set at 30° ($\theta_4 = \theta_5 = \theta_6 = 30°$).

Figure 10:
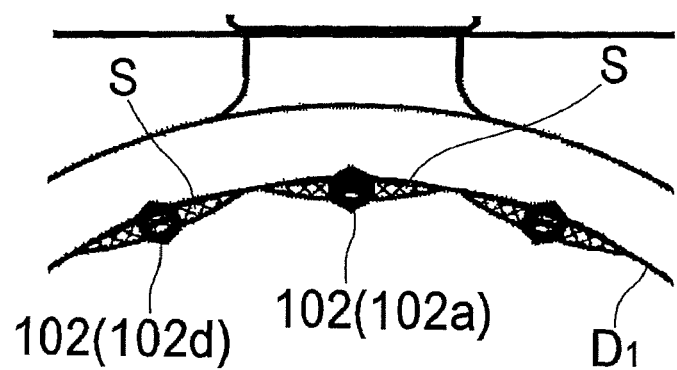
FIG. 10 is an enlarged view of a part of FIG. 8.

As shown in FIG. 10, in this embodiment a fan nozzle is used as each cleaning nozzle 102 so that the jet S of cleaning water spreads laterally and linearly along the contact portion $D_1$ in the periphery of the substrate surface contacting the inner sealing member 66. With this type of nozzle, the jet S of cleaning water can impinge on a wider area on the contact portion $D_1$ or its vicinity and can flow down on the surface of the substrate W.

In operation of the substrate cleaning apparatus 30b of this embodiment, the substrate holder 18 in a vertical position, holding the substrate W immediately after plating, is placed at a predetermined position in the cleaning bath 100. The jet S of cleaning water is then ejected from the cleaning nozzles 102 toward the substrate holder 18 to impinge on the contact portion $D_1$ or its vicinity to thereby clean the surface of the substrate W. A part of the cleaning water, supplied near the contact portion $D_1$, flows around the periphery of the surface of the substrate W along the contact portion $D_1$ due to surface tension, without vertically flowing down the substrate surface.

In this manner, since the jet S of cleaning water impinges on the contact portion $D_1$ or its vicinity, the contact portion $D_1$ can be effectively cleaned with the cleaning water which impinges on the contact portion $D_1$ either directly or indirectly after bouncing off the substrate W. The contact portion $D_1$ can further be cleaned with the cleaning water which flows downward along the contact portion $D_1$, i.e., the continuous annular recess formed between the periphery of the surface of the substrate W and the inner sealing member 66. In addition, the entire surface of the substrate W can be cleaned with the cleaning water vertically flowing down on the surface of the substrate W.

Figure 11A:
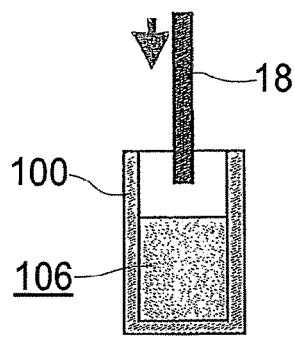
FIGS. 11A, 11B, 11C, 11D, 11E, and 11F are diagrams illustrating a sequence of cleaning processes of a substrate cleaning method according to a first embodiment, performed by using the substrate cleaning apparatus shown in FIGS. 7 through 10.
Figure 11B:
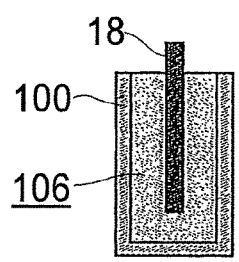

A substrate cleaning method according a first embodiment, performed by using the substrate cleaning apparatus 30b, will now be described with reference to FIGS. 11A through 11F. First, as shown in FIG. 11A, the substrate holder 18, holding the substrate while sealing the periphery of the substrate surface with the inner sealing member 66, is lowered toward the cleaning bath 100 filled with cleaning water 106 and, as shown in FIG. 11B, the substrate held by the substrate holder 18 is immersed in the cleaning water 106 retained in the cleaning bath 100, so that the substrate and the substrate holder 18 in their entirety are cleaned with the cleaning water 106. This cleaning process is basically a process of removing a liquid chemical, adhering to the substrate and the substrate holder 18, by diffusion due to a difference in concentration of the liquid. The longer an immersion time of the substrate holder 18 in the cleaning water 106 is, the larger is an amount of the liquid chemical which diffuses from the substrate holder 18 and the substrate, and thus the higher is the cleaning effect. By agitating the cleaning water 106 with bubbling or with a paddle or the like, the cleaning effect can further be increased in a shorter period of time.

Figure 11C:
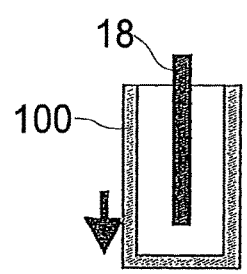

Next, as shown in FIG. 11C, the cleaning water 106, containing the liquid chemical diffused therein through the above-described cleaning process, is discharged from the cleaning bath 100. The bottom of the cleaning bath 100 may be inclined toward the discharge outlet 100a (see FIG. 7), so that the cleaning water 106 can be discharged without remaining in the cleaning bath 100.

Figure 11D:
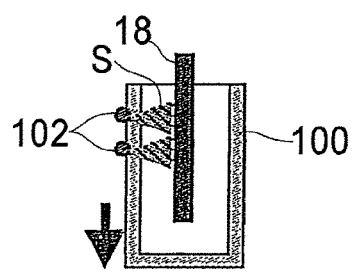

Next, as shown in FIG. 11D, the jet S of cleaning water 106 is ejected from the cleaning nozzles 102 toward the substrate so as to impinge on the contact portion $D_1$ or its vicinity, while the cleaning water 106 supplied is discharged from the cleaning bath 100. This cleaning process can efficiently clean the contact portion $D_1$, while preventing contamination in the cleaning bath 100 by discharging the cleaning water 106, containing the liquid chemical (e.g., a plating solution) diffused therein, from the cleaning bath 100.

Figure 11E:
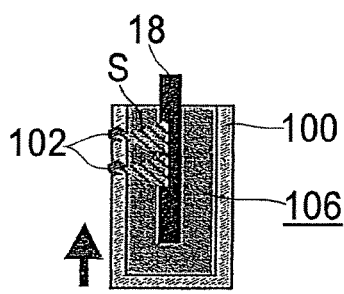

Next, as shown in FIG. 11E, while continuing jetting of the cleaning water from the cleaning nozzles 102 toward the substrate holder 18, the discharge outlet 100a (see FIG. 7) of the cleaning bath 100 is closed. The fresh cleaning water 106 is supplied into the cleaning bath 100, until the substrate holder 18 and the substrate held thereon becomes immersed in the cleaning water 106, whereby the substrate and the substrate holder 18 in their entirety are cleaned by the liquid diffusion.

In order to uniformly clean the substrate holder with the cleaning water jetted from the cleaning nozzles, it is generally necessary to use a large number of cleaning nozzles and a large amount of cleaning water. According to this embodiment, the substrate and the substrate holder 18 can be cleaned uniformly without increasing the amount of cleaning water, because the substrate holder 18 and the substrate are immersed in the cleaning water 106 stored in the cleaning bath 100.

The supply of cleaning water 106 into the cleaning bath 100 may be performed while agitating the cleaning water 106 by using a spray or the like, or may be performed in a short time by using a thick pipe separately provided for the supply of cleaning water.

Figure 11F:
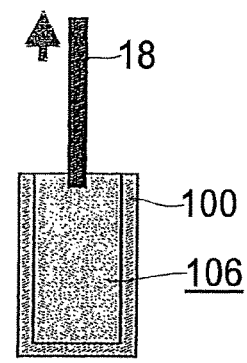

Next, as shown in FIG. 11F, the substrate holder 18 is pulled up from the cleaning water 106 to terminate the cleaning process. The lower a speed at which the substrate holder 18 is pulled up, the smaller is the amount of cleaning water adhering to the substrate holder 18 and the substrate, leading to less contamination by the chemical (e.g., the plating solution) in the next process. The cleaning water 106 remaining in the cleaning bath 100 may optionally be reused for cleaning of the next substrate in order to reduce the amount of cleaning water (pure water) used.

In order to further increase cleanliness of the surface of the substrate, cleaning of the substrate and the substrate holder 18 in their entirety with the cleaning water 106 supplied from the cleaning nozzles 102 in the cleaning bath 100 may be performed multiple times.

Figure 12A:
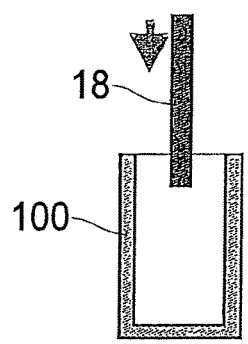
FIGS. 12A, 12B, 12C, 12D, 12E, and 12F are diagrams illustrating a sequence of cleaning processes of a substrate cleaning method according to a second embodiment, performed by using the substrate cleaning apparatus shown in FIGS. 7 through 10.

A substrate cleaning method according to a second embodiment, performed by using the substrate cleaning apparatus 30b, will be described with reference to FIGS. 12A through 12F. First, as shown in FIG. 12A, the substrate holder 18, holding the substrate while sealing the periphery of the substrate surface with the inner sealing member 66, is lowered toward the empty cleaning bath 100 containing no cleaning water 106 therein and placed at a predetermined position in the cleaning bath 100.

Figure 12B:
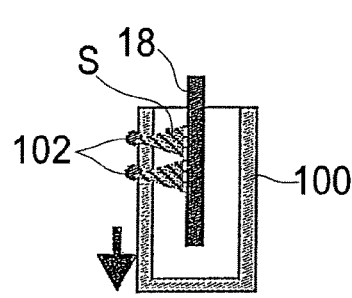

Next, as shown in FIG. 12B, the jet S of cleaning water 106 is ejected from the cleaning nozzles 102 toward the substrate so as to impinge on the contact portion $D_1$ or its vicinity, while the cleaning water 106 supplied is discharged from the cleaning bath 100. This cleaning process can efficiently clean the contact portion $D_1$, while preventing contamination in the cleaning bath 100 by discharging the cleaning water 106, containing the liquid chemical (e.g., a plating solution) diffused therein, from the cleaning bath 100.

Figure 12C:
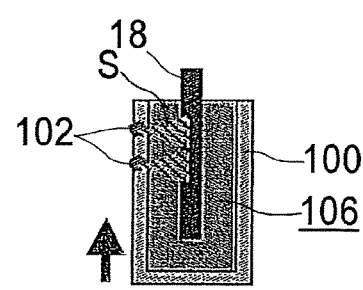

Next, as shown in FIG. 12C, while continuing jetting of cleaning water from the cleaning nozzles 102 toward the substrate holder 18, the discharge outlet 100a (see FIG. 7) of the cleaning bath 100 is closed. The fresh cleaning water 106 is supplied into the cleaning bath 100, until the substrate holder 18 and the substrate held thereon becomes immersed in the cleaning water 106, whereby the substrate and the substrate holder 18 in their entirety are cleaned by the liquid diffusion. As with the first embodiment, this step of cleaning the substrate and the substrate holder 18 in their entirety by immersing them in the cleaning water 106 may be performed multiple times.

Figure 12D:
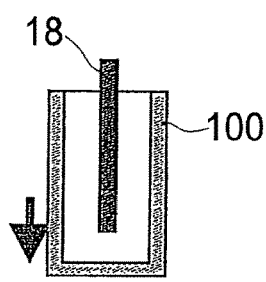
Figure 12E:
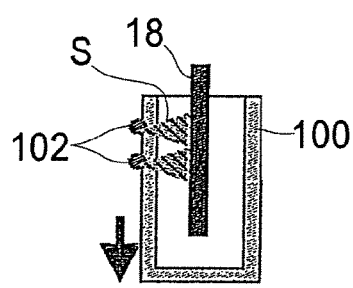

Next, as shown in FIG. 12D, the cleaning water 106, containing the liquid chemical diffused therein through the above cleaning process, is discharged from the cleaning bath 100. Thereafter, as shown in FIG. 12E, the jet S of cleaning water 106 is ejected from the cleaning nozzles 102 toward the substrate so as to impinge on the contact portion $D_1$ or its vicinity, while the cleaning water 106 supplied is discharged from the cleaning bath 100.

Figure 12F:
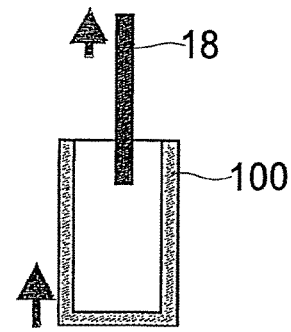

Next, as shown in FIG. 12F, the substrate holder 18 is pulled up from the cleaning bath 100 to terminate the cleaning. It is possible to pull up the substrate holder 18 from the cleaning bath 100 while supplying the jet of cleaning water 106 from the cleaning nozzles 102 and discharging the cleaning water 106 from the cleaning bath 100.

According to the cleaning method of this embodiment, a liquid chemical adhering to the substrate and the substrate holder 18 is first removed by the jet of cleaning water from the cleaning nozzles 102 while the cleaning water supplied is discharged from the cleaning bath 100. This cleaning step can reduce contamination of the cleaning bath 100. In the final cleaning step, the jet of cleaning water is supplied from the cleaning nozzles 102 to the substrate holder 18 to thereby clean not only the contact portion $D_1$ but also the entire substrate surface efficiently. This cleaning step can increase the cleanliness of the substrate. In particular, the cleanliness of the substrate (and the substrate holder 18) can be increased to the same level as the cleaning water jetted from the cleaning nozzles 102.

A sequence of plating processes performed by the above-described plating apparatus will now be described. First, one substrate is removed by the substrate transport device 22 from the cassette 10 mounted on the cassette table 12. The substrate is placed on the aligner 14, which then aligns an orientation flat or a notch of the substrate in a predetermined direction. After the alignment, the substrate is transported to the substrate attachment and detachment unit 20 by the substrate transport device 22.

Two substrate holders 18 stored in the stock unit 24 are simultaneously gripped by the transporter 42 of the substrate holder transport device 40, and transported to the substrate attachment and detachment unit 20. The substrate holders 18 are lowered in a horizontal position until the two substrate holders 18 are simultaneously placed on the stage plate 52 of the substrate attachment and detachment unit 20. Two pneumatic cylinders are then actuated to open the second holding members 58 of the substrate holders 18, respectively.

The substrate is inserted into the center-side substrate holder 18 by the substrate transport device 22, and the pneumatic cylinder is reversely actuated to close the second holding member 58. The second holding member 58 is then locked by means of the locking and unlocking mechanism. After completion of the attachment of the substrate to the substrate holder 18, the stage plate 52 is slid laterally, and a substrate is then attached to the other substrate holder 18 in the same manner. Thereafter, the stage plate 52 is returned to its original position.

The substrate W is secured to the substrate holder 18 with its front surface (to-be-plated surface) exposed in an opening of the substrate holder 18 and its periphery sealed off by the sealing members 66 and 68. These sealing members 66 and 68 can prevent intrusion of the plating solution to allow electrical connection between the electrical contacts 88 and a portion of the substrate that does not contact the plating solution. The wires extending from the electrical contacts 88 are connected to the external contacts provided on the hand 90 of the substrate holder 18. Therefore, an electric current can be fed to a film (e.g., a seed layer) of the substrate W by establishing electrical connection between a power source and the external contacts on the hand 90. The substrate attachment and detachment unit 20 has a sensor for sensing a contact state between the substrate W, attached to the substrate holder 18, and the electrical contacts 88. The sensor, when it determines poor contact between the substrate W and the electrical contacts 88, outputs a signal to a controller (not shown).

Next, the two substrate holders 18 loaded with the substrates W are simultaneously gripped by the transporter 42 of the substrate holder transport device 40 and transported to the stock unit 24. The two substrate holders 18 are lowered in a vertical position until they are suspended in the stock unit 24 for temporary storage. The substrate transport device 22, the substrate attachment and detachment unit 20, and the transporter 42 of the substrate holder transport device 40 successively repeat the above operations to successively attach substrates to the substrate holders 18 which have been stored in the stock unit 24 and successively suspend the substrate holders 18 in predetermined positions in the stock unit 24 for their temporary storage.

Although not shown, instead of providing the substrate attachment and detachment unit 20 on which two substrate holders 18 are placed horizontally, it is possible to provide a fixing station which is configured to receive two substrate holders from the transporter 42 and support the two substrate holders vertically. The substrate holders can be brought into a horizontal position by rotating the fixing station, holding the substrate holders in the vertical position, by 90 degrees.

Although in this embodiment the one locking and unlocking mechanism is provided, it is possible to provide two locking and unlocking mechanisms adjacent to each other and to simultaneously perform locking and unlocking of two substrate holders by the two locking and unlocking mechanisms.

The two substrate holders 18 loaded with the substrates, which are temporarily stored in the stock unit 24, are simultaneously gripped by the other transporter 44 of the substrate holder transport device 40 and transported to the pre-wetting bath 26, where the two substrate holders 18 are lowered until they are located in the pre-wetting bath 26.

The substrate holder 18 holding the substrate whose contact with the electrical contacts 88 is determined to be poor by the sensor stays in the stock unit 24. This enables continuing plating operations without stopping the apparatus despite the occurrence of poor contact between the electrical contacts 88 and the substrate held in the substrate holder 18. The substrate of poor electrical contact is not subjected to plating. This unplated substrate is returned to the substrate cassette and removed from it.

Next, the two substrate holders 18 loaded with the substrates are transported to the pre-soaking bath 28 in the same manner as described above. In the pre-soaking bath 28, an oxide film on each substrate is etched away, so that a clean metal surface is exposed. Thereafter, the substrate holders 18 loaded with the substrates are transported to the water-cleaning bath 30a in the same manner as described above, and the surface of each substrate is cleaned with the pure water stored in the water-cleaning bath 30a according to the above-described QDR cleaning method shown in FIG. 1 or other cleaning method.

The two substrate holders 18 loaded with the substrates after water cleaning are transported to the plating bath 34, which is filled with the plating solution, in the same manner as described above. Each substrate holder 18 is suspended and held at a predetermined position in one of the plating units 38. The transporter 44 of the substrate holder transport device 40 sequentially repeats the above operations to sequentially transport the substrate holders 18 to the plating units 38 of the plating bath 34, and suspend the substrate holders 18 in the plating units 38.

After suspending the substrate holders 18 in all the plating units 38 is completed, plating of a surface of each substrate is performed in the following manner. While supplying the plating solution from the overflow bath 36 to the plating bath 34 through a circulation pipe (not shown) and causing the plating solution to overflow the plating bath 34 into the overflow bath 36, a plating voltage is applied between each substrate W and an anode (not shown) in the plating bath 34. At the same time, the paddle is reciprocated parallel to the surface of the substrate by the paddle drive device 46. During plating of the substrate, the substrate holder 18 is suspended from the top of the plating unit 38 through the hands 90. Electricity is fed from a plating power source to a film (e.g., a seed layer) of the substrate through the electrical conductors 86 and the electrical contacts 88.

After the completion of plating, the application of the plating voltage, the supply of the plating solution, and the reciprocation of the paddle are stopped. Thereafter, the two substrate holders 18 loaded with the plated substrates W are simultaneously gripped by the transporter 44 of the substrate holder transport device 40, and are transported to the substrate cleaning apparatus 30b in the same manner as described above.

The two substrate holders 18 holding the plated substrates W are placed at predetermined positions in the two cleaning baths 100 of the substrate cleaning apparatus 30b, respectively. As described above, the surface of each substrate W and the substrate holder 18 are cleaned by supplying the jet of cleaning water to the substrate holder 18 from the cleaning nozzles 102 and by immersing the substrate holder 18 in the cleaning water 106 retained in the cleaning bath 100.

After cleaning, the substrate holders 18 loaded with the substrates W are transported to the blow bath 32, where air blows toward the substrates W held by the substrate holders 18 to remove water droplets therefrom to thereby dry the substrates W. Thereafter, the substrate holders 18 loaded with the substrates W are returned to the stock unit 24 and are each suspended and held at a predetermined position in the stock unit 24 in the same manner as described above.

The transporter 44 of the substrate holder transport device 40 sequentially repeats the above operations to sequentially return the substrate holders 18, each loaded with the plated substrate, to predetermined positions in the stock unit 24 and suspend the substrate holders 18 in the stock unit 24.

The two substrate holders 18 loaded with the plated substrates W, which have been returned to the stock unit 24, are simultaneously gripped by the other transporter 42 of the substrate holder transport device 40, and are placed on the stage plate 52 of the substrate attachment and detachment unit 20 in the same manner as described above. The substrate holder 18, which holds the substrate whose contact with the electrical contacts 88 is determined to be poor by the sensor and has been kept stored temporarily in the stock unit 24, is also transported and placed on the stage plate 52.

The second holding member 58 of the center-side substrate holder 18 is firstly unlocked by the locking and unlocking mechanism, and the pneumatic cylinder is actuated to open the second holding member 58. The substrate W is prevented from sticking to the second holding member 58 when it opens. In this state, the plated substrate W is removed by the substrate transport device 22 from the substrate holder 18, and transported to the spin drier 16, where the substrate W is spin-dried (drained) by high-speed rotation of the substrate W. The dried substrate W is returned to the cassette 10 by the substrate transport device 22.

After or simultaneously with returning the substrate to the cassette 10, the stage plate 52 is slid laterally and the other substrate is removed from the other substrate holder 18. The substrate is then spin-dried by the spin drier 16, and the dried substrate is returned to the cassette 10 in the same manner.

After returning the stage plate 52 to its original position, the two substrate holders 18, from which the substrates have been removed, are simultaneously gripped by the transporter 42 of the substrate holder transport device 40 and are returned to the predetermined positions in the stock unit 24 in the same manner as described above. Thereafter, other two substrate holders 18, which hold the plated substrates and have been returned to the stock unit 24, are simultaneously gripped by the transporter 42 of the substrate holder transport device 40 and are placed on the stage plate 52 of the substrate attachment and detachment unit 20 in the same manner as described above. Thereafter, the same operations as described above are repeated.

The sequence of operations is completed when all the plated substrates, removed from the substrate holders 18 which have been once returned to the stock unit 24, have been spin-dried and returned to the cassette 10.

Figure 13:
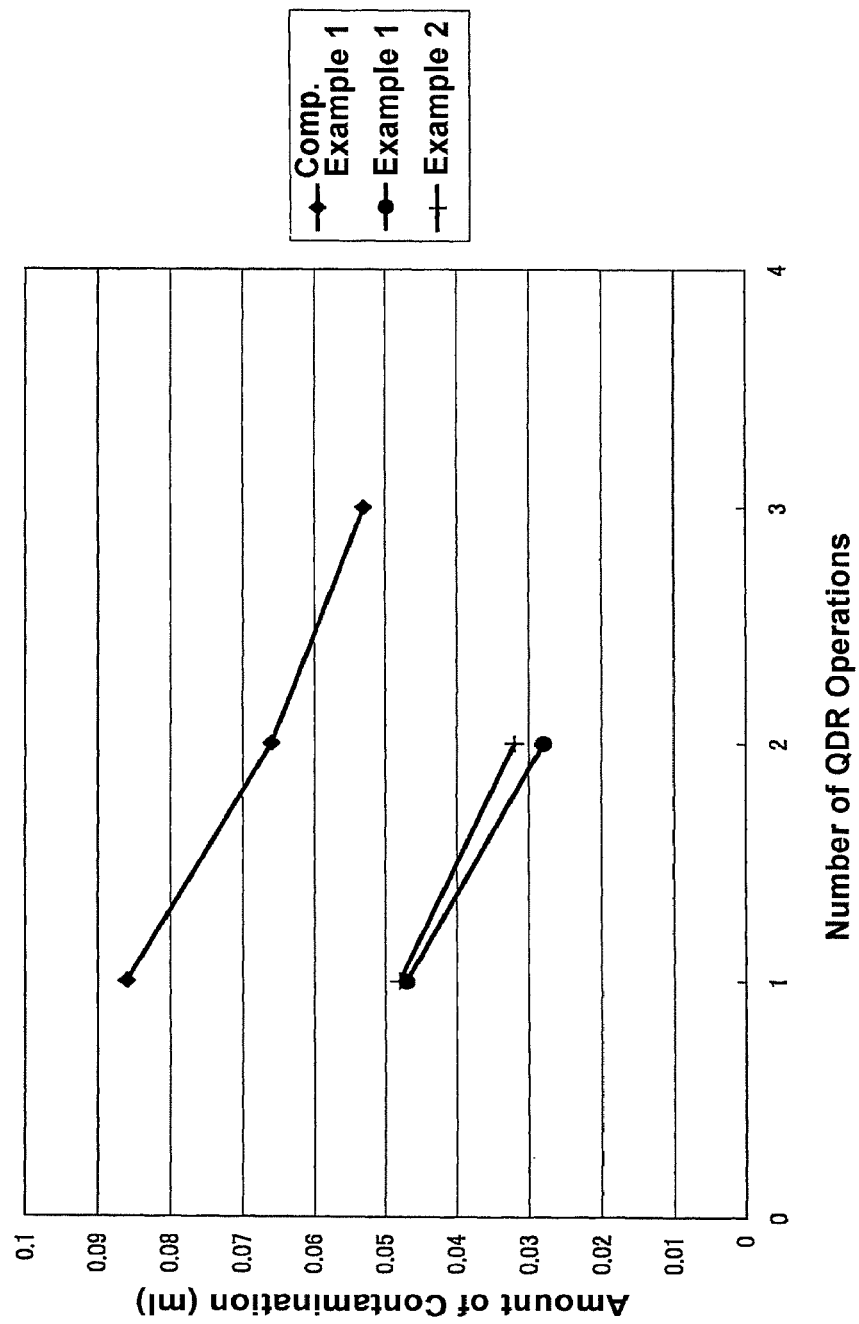
FIG. 13 is a graph showing amount of contamination in Examples 1, 2 and Comparative Example 1.

FIG. 13 shows amount of contamination on the substrate surface, measured after cleaning the substrate surface with pure water according to the cleaning method shown in FIG. 11. Cleaning of the substrate surface was performed immediately after plating of the substrate, using the substrate cleaning apparatus shown in FIGS. 7 through 10. FIG. 13 further shows amount of contamination on the substrate surface, measured after cleaning the substrate surface with pure water according to the conventional QDR cleaning method shown in FIG. 1. The amount of contamination is represented by an amount of the plating solution adhering to the substrate and the substrate holder after cleaning, i.e., contamination in the subsequent process.

In Example 1, the cleaning step shown in FIG. 11D was carried out by supplying the jet of pure water to the substrate surface from all the cleaning nozzles 102 (102a to 102g) provided in the substrate cleaning apparatus shown in FIGS. 7 through 10. The supply of the pure water jet was carried out for 30 seconds at a total flow rate of 9.6 L/min. In Example 2, the cleaning step shown in FIG. 11D was carried out by supplying the jet of pure water to the substrate surface from the cleaning nozzles 102a, 102c, 102d, and 102e which are located at positions corresponding to the upper half of the substrate. The supply of the pure water jet was carried out for 30 seconds at a total flow rate of 4 L/min. In Comparative Example 1, the QDR cleaning step shown in FIG. 1D was carried out for 30 seconds. In FIG. 13, "number of QDR operations" represents the number of above-described cleaning operations. The same is applied to a diagram shown in FIG. 14 which will be described later.

It can be seen from FIG. 13 that even when the cleaning operation is carried out once in Examples 1 and 2, the amount of contamination is lower than that in the case where the conventional QDR cleaning is carried out three times in Comparative Example 1. This indicates that the cleaning method according to the embodiment of the present invention can increase the cleanliness of the substrate while reducing the amount of pure water used. It was observed during cleaning in Examples 1 and 2 that the cleaning water flows down vertically over the substrate surface in its entirety. This fact indicates that there is no problem of drying of the substrate surface during cleaning of the substrate. It was also observed that the cleaning water flows downward along the above-described contact portion of the substrate surface contacting the inner sealing member.

Figure 14:
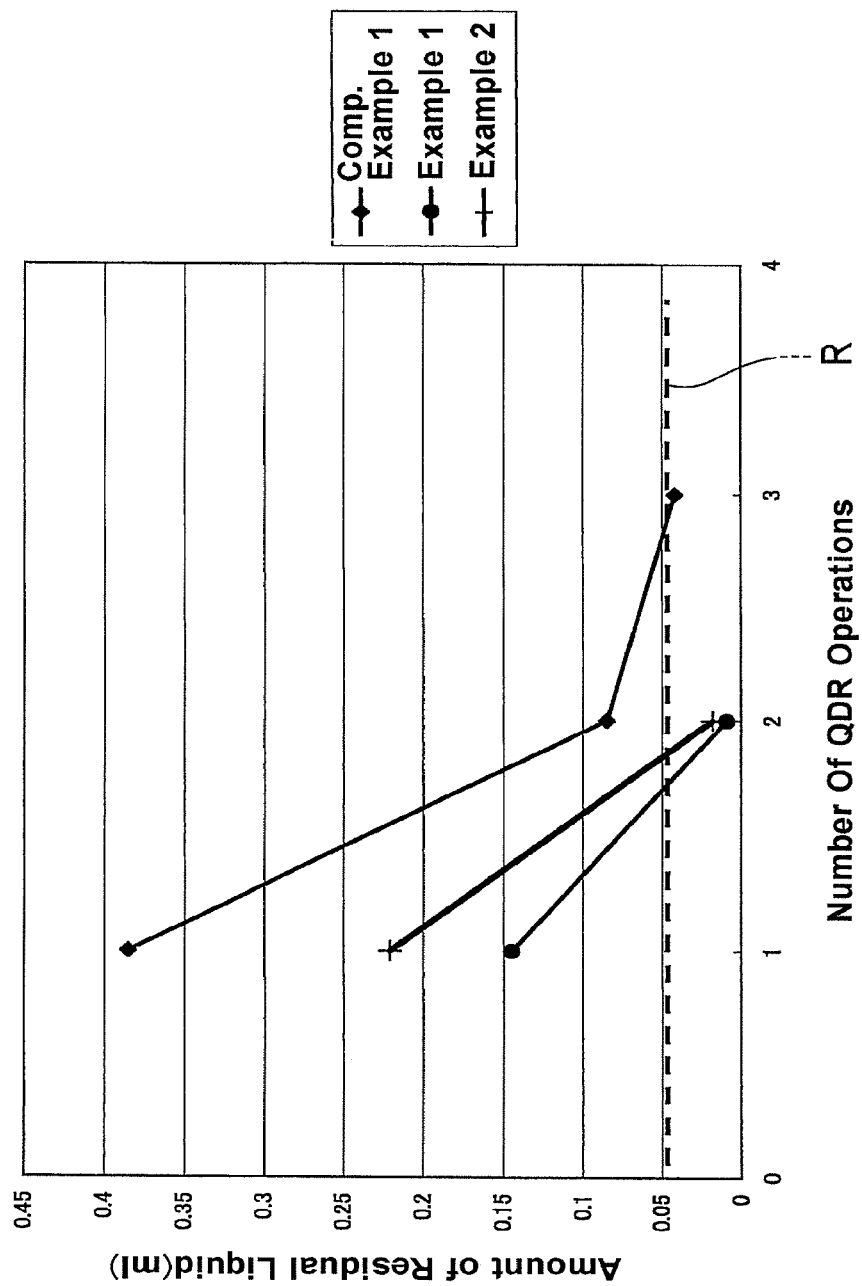
FIG. 14 is a graph showing amount of residual liquid in Examples 1, 2 and Comparative Example 1.

FIG. 14 shows the amount of residual liquid in the Examples 1, 2 and the Comparative Example 1. The amount of residual liquid is represented by an amount of the plating solution contained in the cleaning water remaining in the cleaning bath after cleaning. In FIG. 14, a broken line represents a reference line R as a boundary line of determining whether or not uneven dry of the substrate surface occurs when drying the substrate after cleaning thereof.

As can be seen from FIG. 14, the conventional QDR cleaning operation must be performed three times in the Comparative Example 1 in order to achieve the amount of residual liquid lower than the reference line R, whereas in the Examples 1 and 2 the amount of residual liquid can be lower than the reference line R by performing the cleaning operation twice.

Figure 15:
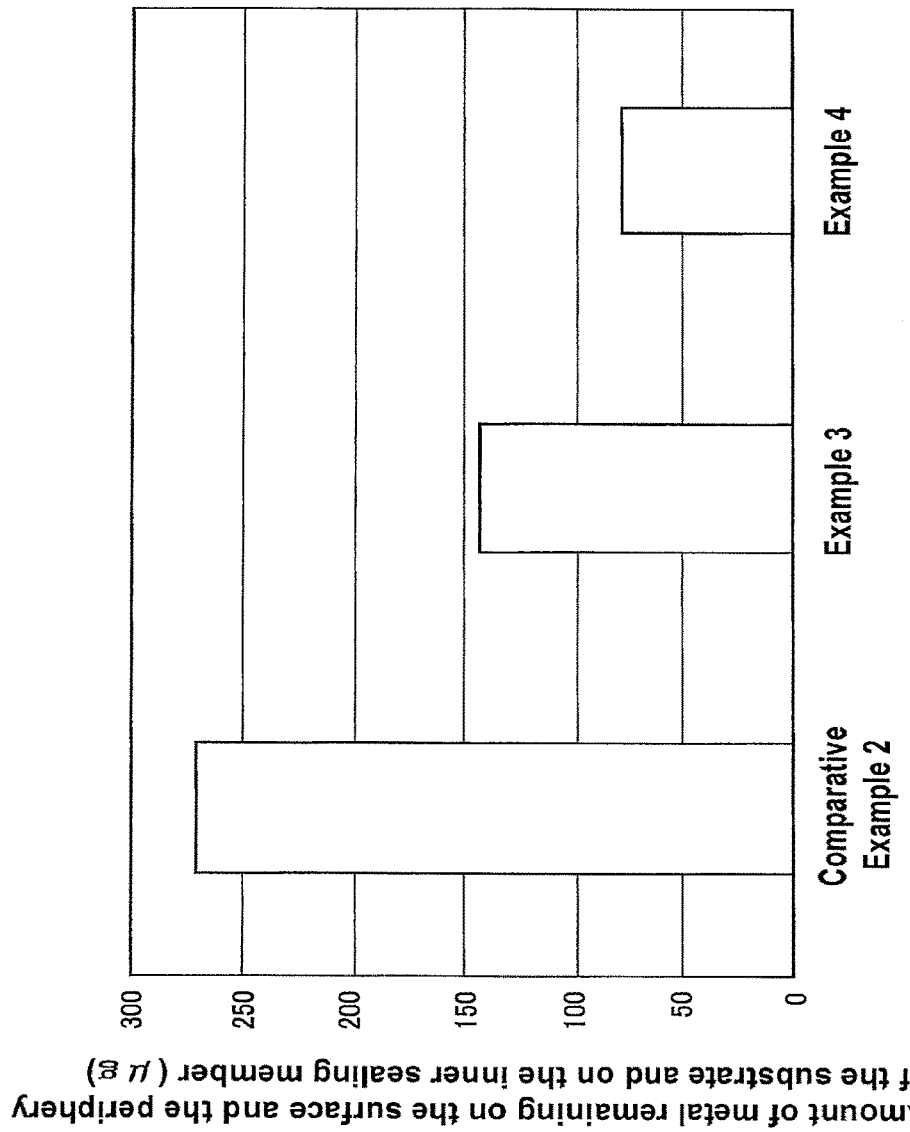
FIG. 15 is a graph showing amount of contamination on a surface and a periphery of the substrate in Examples 3, 4 and Comparative Example 2.

FIG. 15 shows amount of contamination on the surface and the periphery of the substrate and on the inner sealing member 66, measured after cleaning the substrate surface with pure water according to the cleaning method shown in FIGS. 11 and 12. Cleaning of the substrate surface was performed immediately after plating of the substrate, using the substrate cleaning apparatus shown in FIGS. 7 through 10. FIG. 15 further shows amount of contamination on the surface and the periphery of the substrate and on the inner sealing member 66, measured after cleaning the substrate surface with pure water according to the conventional QDR cleaning method shown in FIG. 1. The amount of contamination on the surface and the periphery of the substrate and on the inner sealing member 66 is represented by an amount of metal (e.g., Sn) remaining on the surface and the periphery of the substrate and on the inner sealing member 66, i.e., contamination in the subsequent process. The measurement was conducted as follows. The substrate holder 18 was disposed horizontally and acid chemical (nitric acid) was supplied in the form of droplets onto the substrate surface surrounded by the inner sealing member 66 so as to cover the substrate surface. The supply of the acid chemical was stopped before a liquid level of the acid chemical reaches the height of the inner sealing member 66. Then, the amount of metal dissolved in the acid chemical was measured. The amount of contamination shown in FIG. 13 and the amount of residual liquid shown in FIG. 14 reflect the amount of contamination on the substrate surface and the substrate holder 18 in their entirety, while the measurement method used in the experiment shown in FIG. 15 evaluates the contamination only on the substrate surface and the inner sealing member 66.

The Example 3 in FIG. 15 shows a result of the cleaning process conducted according to the steps of FIGS. 11A to 11F. In particular, the cleaning step shown in FIG. 11D was carried out by supplying the jet of pure water from all the cleaning nozzles 102 (102a to 102g) provided in the substrate cleaning apparatus shown in FIGS. 7 through 10. The supply of the pure water jet was carried out for 30 seconds at a total flow rate of 7.0 L/min. The Example 4 shows a result of the cleaning process conducted according to the steps of FIGS. 12A to 12F. In particular, the cleaning step shown in FIG. 12E was carried out by supplying the jet of pure water from all the cleaning nozzles 102 (102a to 102g) provided in the substrate cleaning apparatus shown in FIGS. 7 through 10. The supply of the pure water jet was carried out for 30 seconds at a total flow rate of 7.0 L/min. In Comparative Example 2, the QDR cleaning step shown in FIG. 1D was carried out for 30 seconds. The number of QDR operations in each of the Examples 3 and 4 and the Comparative Example 2 was two.

It can be seen from FIG. 15 that the Examples 3 and 4 resulted in smaller amount of metal remaining on the surface and the periphery of the substrate and on the inner sealing member 66, compared with the Comparative Example 2. In particular, FIG. 15 shows that the Example 4, in which the pure water jet is supplied from the cleaning nozzles 102 in the final cleaning step to clean the substrate, is most effective in reducing the amount of metal remaining on the surface and the periphery of the substrate and on the inner sealing member 66.

Figure 16:
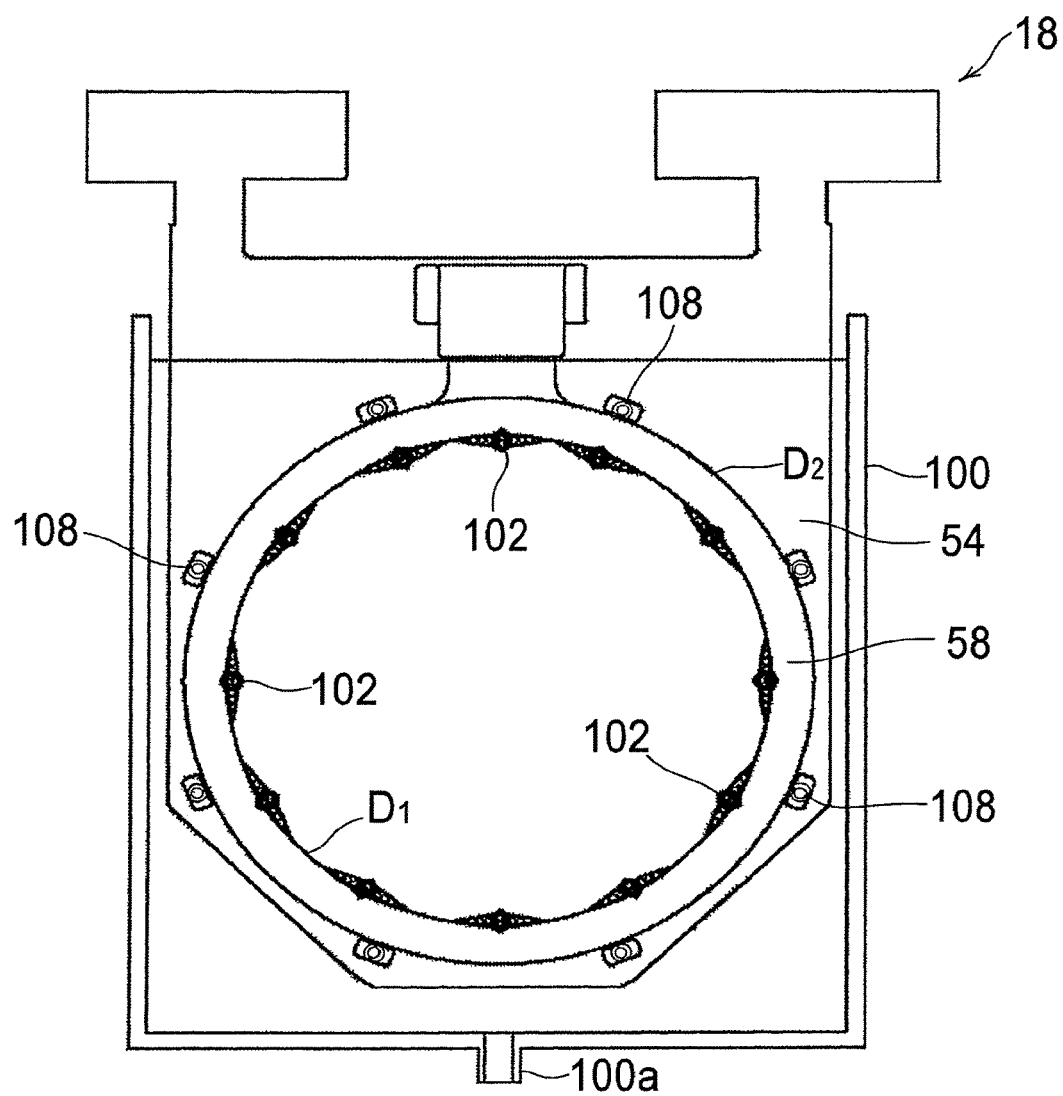
FIG. 16 is a diagram equivalent to FIG. 8, showing a substrate cleaning apparatus according to another embodiment of the present invention.

FIG. 16 shows a substrate cleaning apparatus according to another embodiment of the present invention. The substrate cleaning apparatus of this embodiment differs from the substrate cleaning apparatus shown in FIGS. 7 through 10 in that holder cleaning nozzles 108 are provided concentrically with the outer sealing member 68. The holder cleaning nozzles 108 are arranged so as to supply jet of cleaning water to the contact portion (outer contact portion) $D_2$ or its vicinity. As shown in FIG. 6, the outer contact portion $D_2$ of the outer sealing member 68 is placed in pressure contact with the surface of the first holding member 54 to seal the gap between the first holding member 54 and the second holding member 58 when the substrate W is held by the substrate holder 18. The holder cleaning nozzles 108 are secured to the nozzle plate 104 shown in FIG. 7.

The jet of cleaning water, ejected from each holder cleaning nozzle 108, impinges directly on the outer contact portion $D_2$, or impinges on the surface of the first holding member 54 once and then spreads outward on the surface of the first holding member 54 to impinge on the outer contact portion $D_2$ in a direction approximately parallel to the surface of the first holding member 54.

Thus, according to this embodiment, the cleaning water is jetted from the holder cleaning nozzles 108 toward the outer contact portion $D_2$ of the outer sealing member 68 of the substrate holder 18 disposed in a predetermined position in the cleaning bath 100. The outer contact portion $D_2$ can be cleaned with the jet of cleaning water that impinges on the outer contact portion $D_2$ or its vicinity, and can be cleaned with the cleaning water flowing downward along the outer contact portion $D_2$.

The cleaning of the outer contact portion $D_2$ of the substrate holder 18 with the cleaning water jet supplied from the holder cleaning nozzles 108 may be carried out simultaneously with the cleaning of the surface of the substrate W and the substrate holder 18 with the cleaning water jet supplied from the cleaning nozzles 102.

It is also possible to additionally provide nozzles for supplying jet of cleaning water to the clampers 74 mounted to the first holding member 54.

Although in the above-described embodiments the present invention is applied to the substrate cleaning apparatus for cleaning the substrate after plating, the present invention can of course be applied to the water-cleaning bath 30a for cleaning the substrate after pre-soaking.

While the present invention has been described with reference to preferred embodiments, it is understood that the present invention is not limited to the embodiments described above, but is capable of various changes and modifications within the scope of the inventive concept as expressed herein.

What is claimed is:

1. A substrate cleaning apparatus, comprising:
   a cleaning bath in which a substrate holder configured to hold a substrate is disposable in a vertical position when the apparatus is operational, the substrate holder having a sealing member configured to contact a surface of the substrate at a plurality of contact portions along a periphery of the surface of the substrate, the sealing member configured to seal a gap between the substrate and the substrate holder; and
   cleaning nozzles, affixed in a plane (X, Y) in a circular concentric arrangement around a point of origin (O), each of the cleaning nozzles configured to supply a jet of cleaning water to the substrate holder, the cleaning nozzles being directly secured to an inner surface of a peripheral wall of said cleaning bath, each of the cleaning nozzles aligned only at a position corresponding to a contact portion of the substrate surface contacting the sealing member such that the jet of cleaning water impinges on a corresponding contact portion of the substrate when the substrate is held in the substrate holder,
   wherein:
   the sealing member comprises a first sealing member; and
   said apparatus further comprises holder cleaning nozzles arranged concentrically with a second sealing member for sealing a gap between holding members of the substrate holder, said holder cleaning nozzles being located at such positions that a jet of cleaning water, supplied from each holder cleaning nozzle, impinges on the second sealing member or a vicinity of the second sealing member.

2. The substrate cleaning apparatus according to claim 1, wherein:
   the cleaning nozzles comprise an uppermost and a lowermost cleaning nozzle lying on a vertical Y-axis of the plane (X, Y), at least one pair of upper cleaning nozzles and at least one pair of lower cleaning nozzles are symmetrical with respect to the Y-axis lying along an arc of the circular concentric arrangement, and a pair of intermediate cleaning nozzles lying on a horizontal X-axis of the plane (X, Y);
   the upper cleaning nozzles are placed between the uppermost cleaning nozzle and the intermediate cleaning nozzles, and the lower cleaning nozzles are placed between the lowermost cleaning nozzle and the intermediate cleaning nozzles; and
   the cleaning nozzles are positioned in a clockwise direction along the circular concentric arrangement such that the distance between a first cleaning nozzle and a second cleaning nozzle that is positioned adjacent to the first cleaning nozzle is either equal to or less than the distance between the second cleaning nozzle and a third cleaning nozzle that is positioned adjacent to the second cleaning nozzle.

3. The substrate cleaning apparatus according to claim 1, wherein a center of a portion of the substrate holder aligns with the origin (O) of the plane (X, Y) when the substrate holder is disposed within the cleaning bath.

4. The substrate cleaning apparatus according to claim 1, wherein each of the cleaning nozzles is a fan nozzle configured to cause the jet of cleaning water to spread laterally and linearly along the corresponding contact portion.

5. The substrate cleaning apparatus according to claim 1, wherein the cleaning bath has, at a bottom, a discharge outlet which can be opened and closed, the discharge outlet being configured to be opened to allow the cleaning water to be discharged from the cleaning bath through the discharge outlet when the cleaning nozzles are supplying the jet of the cleaning water.

* * * * *